US006993059B2

(12) United States Patent
Anikitchev et al.

(10) Patent No.: US 6,993,059 B2
(45) Date of Patent: Jan. 31, 2006

(54) APPARATUS FOR REDUCING SPACING OF BEAMS DELIVERED BY STACKED DIODE-LASER BARS

(75) Inventors: Serguei G. Anikitchev, Belmont, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 271 days.

(21) Appl. No.: 10/458,833

(22) Filed: Jun. 11, 2003

(65) Prior Publication Data

US 2004/0252744 A1 Dec. 16, 2004

(51) Int. Cl.
*H01S 3/08* (2006.01)

(52) U.S. Cl. .......................... 372/106; 372/100; 372/75
(58) Field of Classification Search ............. 372/43–50, 372/75, 100, 106
See application file for complete search history.

(56) References Cited

U.S. PATENT DOCUMENTS

| 4,978,197 A | 12/1990 | Horikawa | 350/174 |
| 5,155,623 A | 10/1992 | Miller et al. | 359/495 |

(Continued)

FOREIGN PATENT DOCUMENTS

| DE | 200 10 309 U1 | 6/2000 |
| DE | 101 13 019 A1 | 3/2001 |
| EP | 1 143 584 A2 | 10/2001 |
| JP | 2002-148562 | 5/2002 |
| WO | WO 00/57229 | 9/2000 |
| WO | WO 00/60399 | 10/2000 |
| WO | WO 01/27686 A1 | 4/2001 |

OTHER PUBLICATIONS

J.D. Minelly et al., "Diode–Array Pumping of $Er^{3+}/Yb^{3+}$ Co–Doped Fiber Lasers and Amplifiers," *IEEE Photonics Technology Letters*, vol. 5, No. 3, Mar. 1993, pp. 301–303.
"Uniform Line Illumination with Small Area High Radiant Sources," *IBM Technical Disclosure Bulletin*, vol. 35, No. 3, Aug. 1992, 2 pages in length.
U.S. Appl. No. 10/266,066, filed Oct. 7, 2002, by Serguei Anikitchev and Mathew Rekow, entitled: Method and Apparatus for Coupling Radiation from a Stack of Diode–Laser Bars into a Single–Core Optical Fiber, 53 pages in length.

*Primary Examiner*—Min Sun Harvey
*Assistant Examiner*—Delma R. Flores-Ruiz
(74) *Attorney, Agent, or Firm*—Stallman & Pollock LLP

(57) ABSTRACT

Apparatus for reducing spacing between a plurality of parallel, spaced apart plane-polarized laser-radiation beams delivered by a stack of laser-diode bars includes a ninety degree polarization rotator, and a compound prism including a total reflecting surface an internal polarization-selective surface parallel to each other. The polarization-selective surface is highly transmissive for radiation plane-polarized in one polarization orientation and highly reflective for radiation plane-polarized at ninety degrees to that orientation. The polarization rotator rotates the polarization of a portion of the beams. The beams are transmitted through the compound prism with the portion of polarization-rotated beams following a different path through the prism from that of the beams that are not polarization rotated. The beams exit the prism with spacing therebetween one-half of the spacing between beams entering the prism.

30 Claims, 14 Drawing Sheets

U.S. PATENT DOCUMENTS

| | | | |
|---|---|---|---|
| 5,258,989 A | 11/1993 | Raven | 372/6 |
| 5,513,201 A * | 4/1996 | Yamaguchi et al. | 372/75 |
| 5,650,873 A | 7/1997 | Gal et al. | 359/487 |
| 5,798,877 A | 8/1998 | Nightingale et al. | 359/831 |
| 6,064,528 A | 5/2000 | Simpson, Jr. | 359/619 |
| 6,151,342 A | 11/2000 | Nightingale et al. | 372/36 |
| 6,175,452 B1 | 1/2001 | Ullmann et al. | 359/641 |
| 6,212,216 B1 | 4/2001 | Pillai | 372/96 |
| 6,229,831 B1 | 5/2001 | Nightingale et al. | 372/36 |
| 6,337,873 B1 | 1/2002 | Goering et al. | 372/69 |
| 6,356,577 B1 | 3/2002 | Miller | 372/107 |
| 6,680,800 B1 | 1/2004 | Schreiber et al. | 359/618 |
| 6,683,727 B1 | 1/2004 | Göring et al. | 359/639 |
| 6,851,610 B2 * | 2/2005 | Knowles et al. | 235/462.01 |
| 2004/0067016 A1 | 4/2004 | Anikitchev et al. | 385/34 |
| 2004/0091209 A1 | 5/2004 | Mikhailov | 385/31 |

* cited by examiner

APPARATUS FOR REDUCING SPACING OF BEAMS DELIVERED BY STACKED DIODE-LASER BARS

TECHNICAL FIELD OF THE INVENTION

The present invention relates in general to linear arrays of diode-lasers, generally referred to as diode-laser bars. The invention relates in particular to the use of a polarization rotator and a compound prism for concentrating the output of a stack of such diode-laser bars.

DISCUSSION OF BACKGROUND ART

Laser-radiation from diode-laser arrays is frequently used for tasks such as heating material for surface treatment, and optically pumping solid-state lasers. The diode-laser array may be a one-dimensional (linear) array or a two-dimensional array. Typically, a one-dimensional array of diode-lasers is made by forming a plurality of diode-lasers (emitters) in a common substrate. This is commonly referred to as a diode-laser bar. A plurality of such bars can be stacked to form a two-dimensional diode-laser array.

Typically, a diode-laser bar for providing laser-radiation having a wavelength of between about 800 and 1000 nanometers (nm) is about 10 millimeters (mm) long, about 1 mm wide and may include between about 2 and 50 individual emitters, spaced-apart along the diode-laser bar. The emitters have a rectangular emitting-aperture about 1 micrometer ($\mu$m) high and between about 50 $\mu$m and 100 $\mu$m wide. The emitters are arranged with their emitting-apertures aligned in the width direction of the emitters, which is in the length direction of the diode-laser bar. Accordingly, the emitters in a diode-laser bar may be spaced apart by only a few micrometers in the length direction of a bar.

When diode-laser bars are stacked to form a two-dimensional array of diode-lasers, spacing of corresponding diode-lasers in adjacent bars is determined by the thickness of the bar and any cooling device associated with the bar. This results in a vertical spacing of emitters which may be no less than about a millimeter. It would be useful to provide optical apparatus that could provide the effect of more closely vertically spaced emitters in a two dimensional array of diode-lasers.

SUMMARY OF THE INVENTION

The present invention is directed to apparatus for reducing spacing between plurality M+N of laser-radiation beams, each of the beams being plane-polarized in one of a first and a second mutually perpendicular polarization orientations. The beams are parallel to each other, and spaced apart by a distance V. In one aspect the apparatus comprises a polarization rotator arranged to rotate the polarization plane of a beam by ninety degrees. The apparatus further includes a compound prism having a total reflecting surface and a polarization-selective surface. The polarization-selective surface is highly transmissive for radiation plane-polarized in the first polarization orientation and highly reflective for radiation plane-polarized in the second polarization orientation. The total reflection surface and the polarization-selective surface are parallel to each other.

In one embodiment of the invention wherein the beams are plane-polarized in the first polarization orientation, at least one of the N beams has the polarization-orientation thereof rotated by the polarization-rotator and is transmitted through the compound prism via sequential reflections from total reflection surface and the polarization-selective surface, and at least one of the M beams is transmitted through the compound prism via transmission through the polarization-selective surface. In another embodiment of the invention wherein the beams are plane-polarized in the second polarization orientation, at least one of the M beams has the polarization-orientation thereof rotated by the polarization-rotator and is transmitted through the compound prism via the polarization-selective surface, and at least one of the N beams is transmitted through the compound prism via sequential reflections from total reflection surface and the polarization-selective surface. In each embodiment the compound prism is configured such that adjacent ones of the transmitted beams exit the compound prism parallel to each other, and spaced apart by a second distance less than the first distance, and preferably equal to about V/2.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
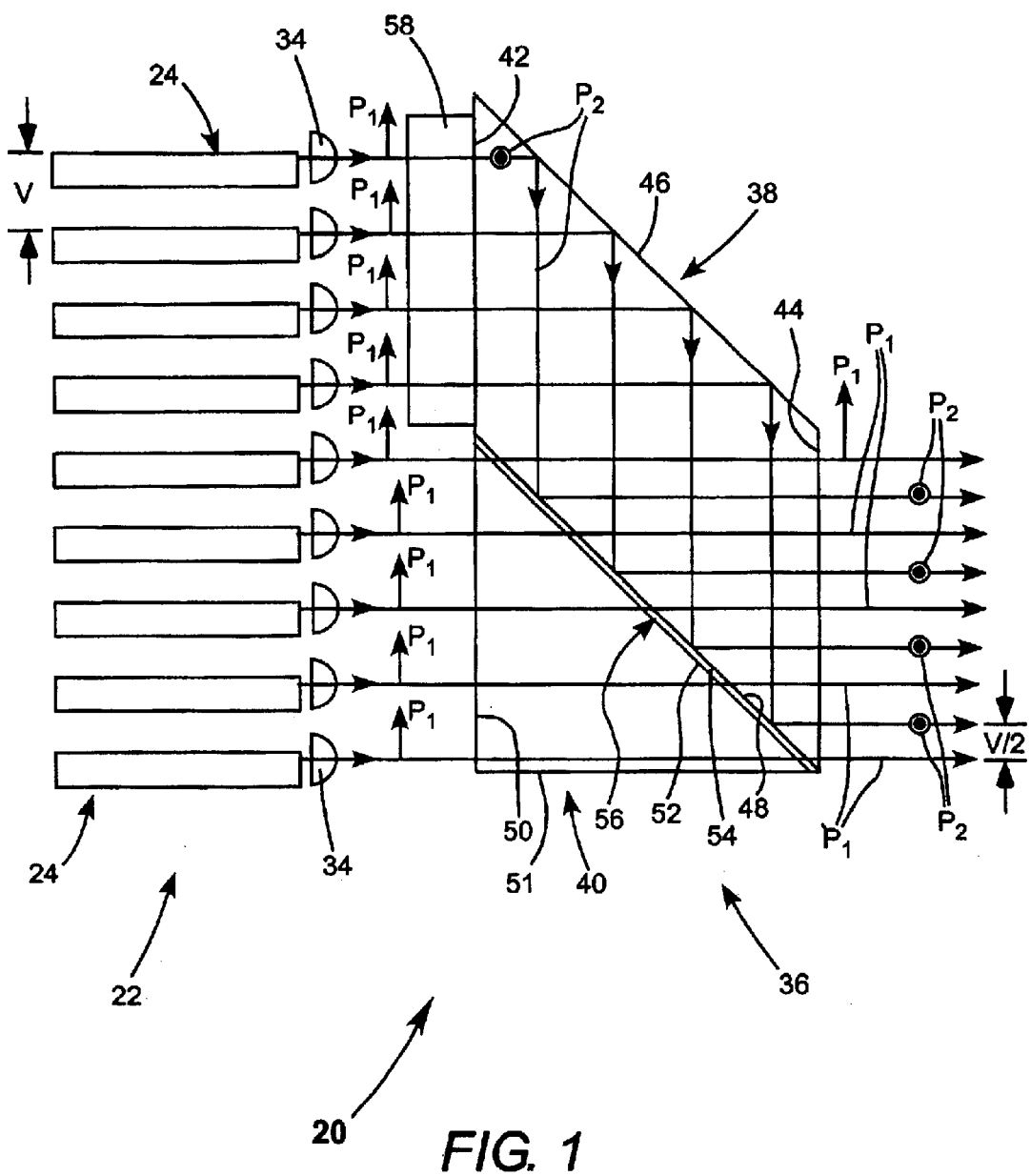
FIG. 1 is an elevation view schematically illustrating a first embodiment of apparatus in accordance with the present invention, including a vertical stack of diode-laser bars, and a polarization rotator and a two-element compound prism arranged to half the vertical spacing of output beams of the diode-laser bars.
Figure 2:
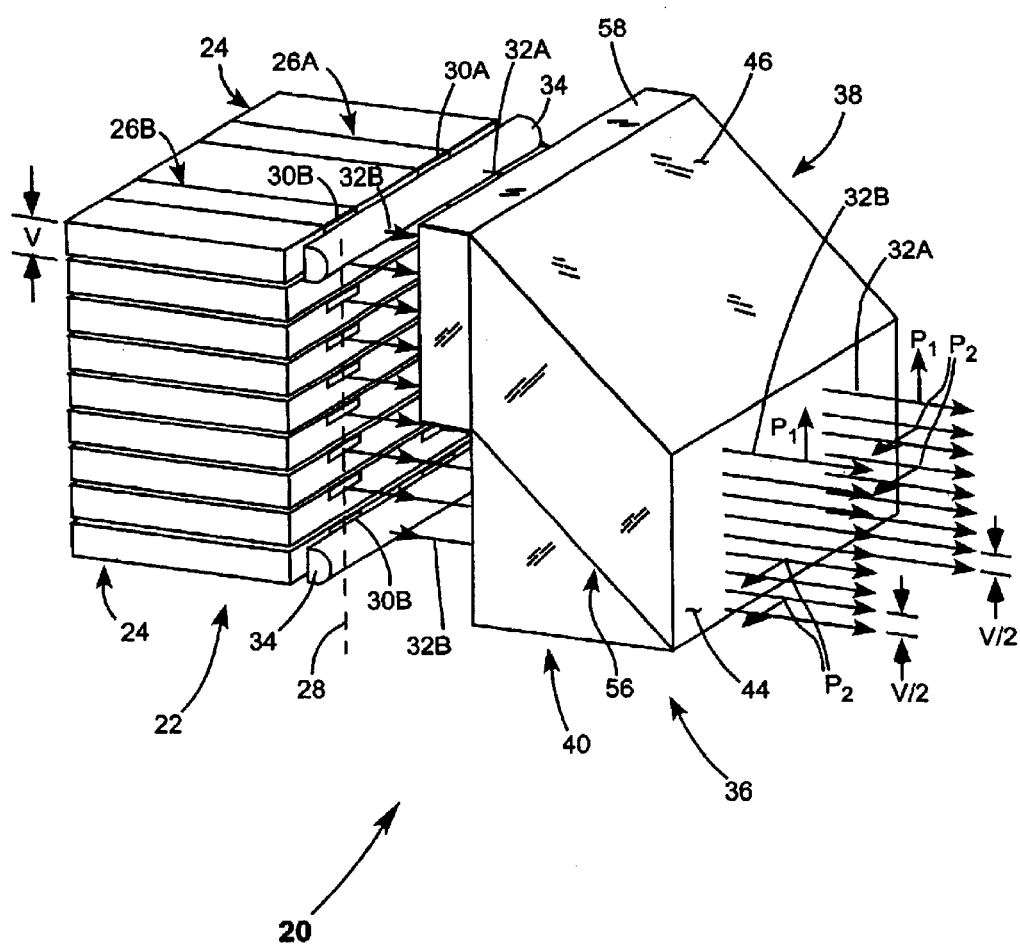
FIG. 2 is a three-dimensional view schematically illustrating one example of the apparatus of FIG. 1.

Referring now to the drawings wherein like features are designated by like reference numerals, FIG. 1 and FIG. 2 schematically illustrate a first embodiment 20 of apparatus in accordance with the present invention. Apparatus 20 includes a vertical stack 22 of diode-laser bars 24. Each diode-laser bar includes two diode-lasers (emitters) 26A and 26B having emitting apertures 30A and 30B respectively. Diode-laser bars are shown with only two emitters, here, for convenience of illustration. The present invention is equally applicable to diode-laser bars having more than two emitters as well as to a vertical stack of individual emitters. In FIG. 2, corresponding emitters in each diode-laser bar are depicted as being vertically aligned as indicated by dotted line 28. This should not be construed, however, as limiting the present invention.

In each diode-laser bar, emitters 26A and 26B emit beams 32A and 32B, respectively, from emitting apertures 30A and 30B respectively (see FIG. 2). Beams, here, are depicted by single lines, representing the propagation direction of the beams, for convenience of illustration. The diode-laser bars are arranged such that the beams propagate parallel to each other. Those familiar with the diode-laser art will recognize that a diode-laser emits a beam that diverges at a half angle of about 35° in a so-called fast-axis and at a half-angle of between about 5° and 15° in a so-called slow-axis direction. The fast-axis direction and slow-axis direction are respectively perpendicular and parallel to the length direction of the emitting aperture, i.e., respectively perpendicular and parallel to the length direction of the diode-laser bar. The divergence in the slow-axis direction is directly dependent, inter alia, on the width of the diode-laser. Each diode-laser bar 24 is provided with a cylindrical lens 34 arranged to collimate beams 32A and 32B in the fast-axis direction only. Only two lenses 34 are depicted in FIG. 2 for convenience of illustration.

Output beams from diode-lasers are plane-polarized. The beams may be plane-polarized with the electric vector in the fast-axis direction or the slow-axis direction, depending inter alia, on the method by which the diode-lasers are grown. In FIGS. 1 and 2 the beams are depicted with the electric vector parallel to the fast-axis direction as indicated by arrows $P_f$. Diode-laser bars having this polarization orientation are available from Coherent Inc. of Santa Clara, Calif.

Output beams 32A and 32B from diode-laser bar stack 22 have a vertical spacing V corresponding to the vertical spacing of diode-laser bars 24 in the stack. The output beams are directed toward a composite prism 36 having a parallelepiped prism component 38 and a triangular prism component 40. Triangular prism 40 has right-angle faces 50 and 51, and a hypotenuse face 52. Right-angle face 50 serves as an entrance face. Hypotenuse face 52 is depicted in FIG. 1 as being at 45° to right-angle faces 50 and 51 but this should not to be construed as limiting the present invention. Parallelepiped prism 38 has opposite parallel faces 42 and 44. These faces are transmissive and serve as respectively entrance and exit faces. Parallelepiped prism 38 also has opposite parallel faces 46 and 48. These faces are inclined at 45° and 135° to faces 42 and 44. Here again, these angles should not be construed as limiting the present invention. Face 46 is internally reflective for light incident thereon at 45°.

Face 48 of parallelepiped prism 38 and hypotenuse face 52 of triangular prism 40 are optically bonded together with a highly polarization sensitive (when optically immersed in a medium having the refractive index of the prisms) reflecting coating 54 therebetween. Coating 54 may be deposited on either surface 52 or surface 48. Bonding may be effected using an optical cement or even by optically contacting the surfaces. Bonding these surfaces with the coating provides, in effect, a single internal surface 56 that is highly transmissive, for example greater than 99% transmissive, for radiation incident at 45° plane-polarized in orientation $P_1$.

Surface 56 is highly reflective, for example greater than 99% reflective, for radiation incident at 45° plane-polarized in an orientation $P_2$ at 90° to orientation $P_1$.

Five pairs 32A and 32B of beams polarized in orientation $P_1$ enter compound prism 36 through face 50 of triangular prism component 40 of the compound prism, are transmitted through polarization selective reflecting surface 58, and exit the compound prism via face 44 of parallelepiped prism component 38. Four pairs 32A and 32B of beams polarized in orientation $P_1$ are transmitted through a half-wave plate 58 (polarization rotator), which rotates the plane of polarization of the beams by 90° into orientation $P_2$. Polarization rotator 58 is depicted here as being bonded to compound prism 36. This should not be considered as limiting the present invention, as the polarization may be free standing.

The four beam-pairs polarized in orientation $P_2$ are reflected from face 46 of parallelepiped prism 38 and then reflected from polarization selective reflecting surface 56 of compound prism 36. After reflection from surface 56 the $P_2$-polarized beams exit compound prism 36 via face 44 of parallelepiped prism component 38. The dimensions of compound prism 36 are selected, cooperative with the angles at which component prism faces are inclined, such that each $P_2$-polarized beam leaves the compound prism parallel to and midway between two $P_1$-polarized beams. This reduces the vertical spacing between pairs of beams leaving compound prism 36 to a value V/2, i.e., one-half the spacing of corresponding beam-pairs leaving diode-laser bars 24 in stack 22 thereof. In this example the V/2 spacing of beam pairs is effected by making the vertical spacing between faces 46 and 48 (the height of face 42) of parallelepiped prism component 38 equal to nV plus V/2, where n is the number of bars in the upper group.

Figure 3:
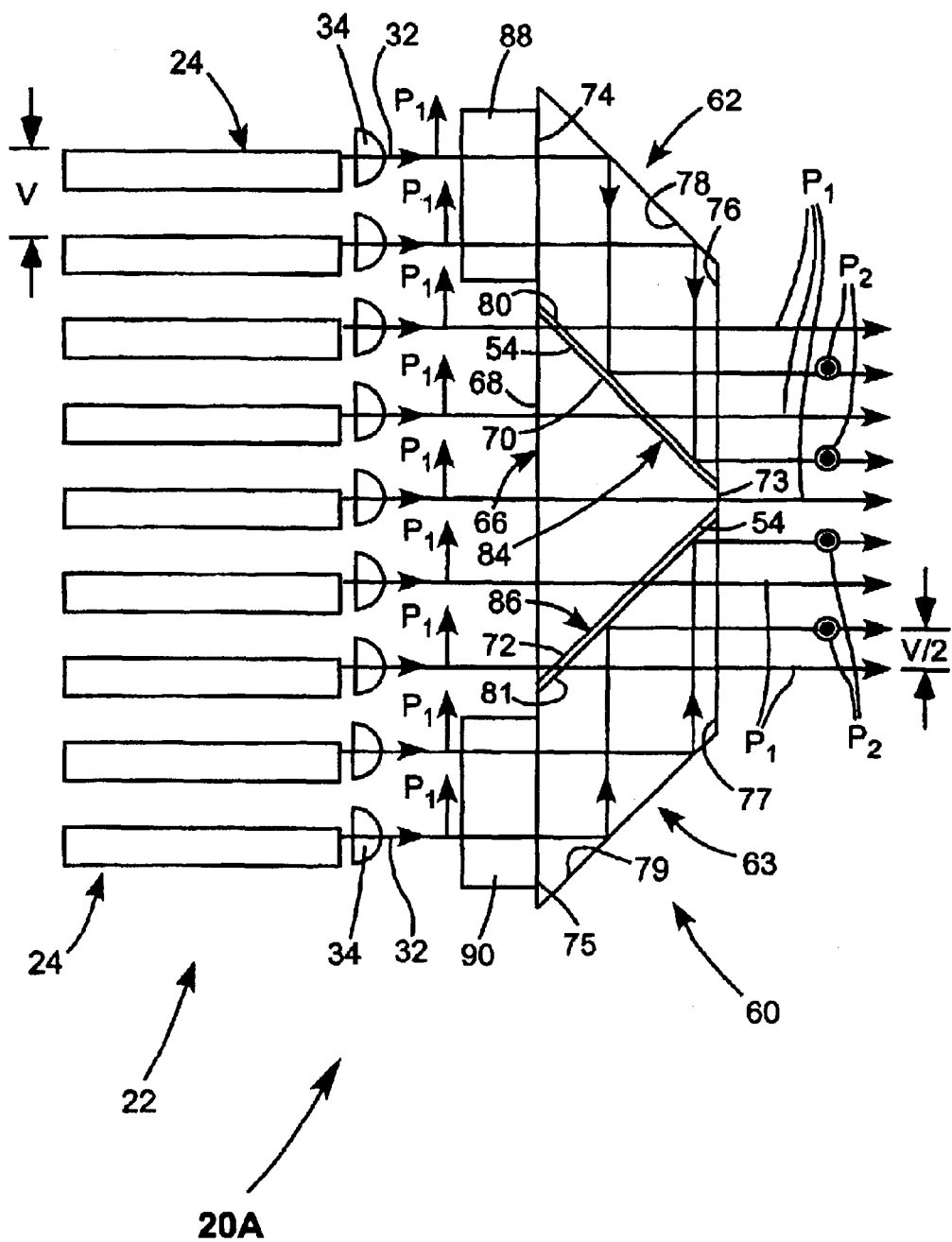
FIG. 3 is an elevation view schematically illustrating a second embodiment of apparatus in accordance with the present invention including a vertical stack of diode-laser bars, two polarization rotators and a three-element compound prism arranged to half the vertical spacing of output beams of the diode-laser bars.

Referring now to FIG. 3, a second embodiment 20A of apparatus in accordance with the present invention includes a stack 22 of diode-laser bars 24 configured as discussed above with respect to FIGS. 1 and 2. Apparatus 20A includes a compound prism 60 including two parallelepiped prism components 62 and 63, and a truncated, isosceles, triangular prism component 66.

Triangular prism 66 has a base face 68 and isosceles faces 70 and 72. Base face 68 serves as an entrance face. There is a truncation face 73 between isosceles faces and 70 and 72. Isosceles faces 70 and 72 are depicted in FIG. 3 as being at 90° to each other but this should not be construed as limiting the present invention. Truncation face 73 is depicted in FIG. 3 as being parallel to base face 69 but this should also not be construed as limiting the present invention.

Parallelepiped prism 62 has opposite parallel faces 74 and 76, and parallelepiped prism 63 has corresponding opposite parallel faces 75 and 77. These faces are transmissive and serve, in each case, as respectively entrance and exit faces. Parallelepiped prism 62 also has opposite parallel faces 78 and 80, and parallelepiped prism 63 has corresponding opposite parallel faces 79 and 81. Faces 78 and 80 of parallelepiped prism 62 are inclined at 45° and 135° to faces 74 and 76. Faces 79 and 81 of parallelepiped prism 63 are inclined at 45° and 135° to faces 75 and 77. Here again, these angles should not be construed as limiting the present invention. Face 78 of parallelepiped prism 62 and face 79 of parallelepiped prism 63 are each internally reflective for light incident thereon at 45°.

Face 80 of parallelepiped prism 62 and isosceles face 70 of triangular prism 66 are optically bonded together, and face 81 of parallelepiped prism 63 and isosceles face 72 of triangular prism 66 are also optically bonded together. These prism faces are bonded together, in each case, with a highly polarization sensitive coating 54 therebetween, as discussed above with respect to compound prism 36 of FIG. 1. Bonding these surfaces with the coating provides in effect two single internal surfaces 84 and 86 that are each highly transmissive for radiation incident thereon at 45°, plane-polarized in orientation $P_1$, and highly reflective, for radiation incident thereon at 45°, plane-polarized in an orientation $P_2$.

Five beam pairs 32 (actually beam pairs 32A and 32B as seen in FIG. 2) polarized in orientation $P_1$ enter compound prism 60 through base face 68 of triangular prism component 66 of the compound prism. Two of these five pairs of beams are transmitted through polarization selective reflecting surface 84, and exit the compound prism via face 76 of parallelepiped prism 62 of the compound prism. One of these five pairs of beams exits the compound prism via truncation face 73 of triangular prism 66 of the compound prism. Another two of these five pairs of beams are transmitted through polarization selective reflecting surface 86, and exit the compound prism via face 77 of parallelepiped prism 63 of the compound prism.

Two pairs 32A and 32B of beams polarized in orientation $P_1$ are transmitted through a half-wave plate 88 (polarization rotator), which rotates the plane of polarization of the beams by 90° into orientation $P_2$. The two beam-pairs polarized in orientation $P_2$ are reflected from face 78 of parallelepiped prism 62 and then reflected from polarization selective reflecting surface 84 of compound prism 60. After reflection from surface 84 the $P_2$-polarized beams exit compound prism 60 via face 76 of parallelepiped prism 62 of the compound prism. Another two pairs 32A and 32B of beams polarized in orientation $P_1$ are transmitted through a half-wave plate 90, which rotates the plane of polarization of the beams by 90° into orientation $P_2$. These two pairs of beams undergo reflections at face 79 of parallelepiped prism 63 and surface 86 of the compound prism, exiting the compound prism via face 77 of parallelepiped prism 63.

The dimensions of compound prism 60 are selected, cooperative with the angles at which component prism faces are inclined, such that each $P_2$-polarized beam leaves the compound prism parallel to and midway between two $P_1$-polarized beams. This reduces the vertical spacing between pairs of beams leaving compound prism 36 to a value V/2, i.e., one-half the spacing of corresponding beam-pairs leaving diode-laser bars 24 in stack 22 thereof. This is the same result as is achieved by above described apparatus 20 of FIG. 1. An advantage of apparatus 20A compared with apparatus 20 is that beams traverse a shorter path in compound prism 60 than in compound prism 36. This can be of advantage in limiting beam width due to divergence in the slow-axis. A disadvantage of apparatus 20A compared with apparatus 20 is that compound prism 60 is more complex than compound prism 36 and, accordingly, may be more expensive to manufacture.

Figure 4:
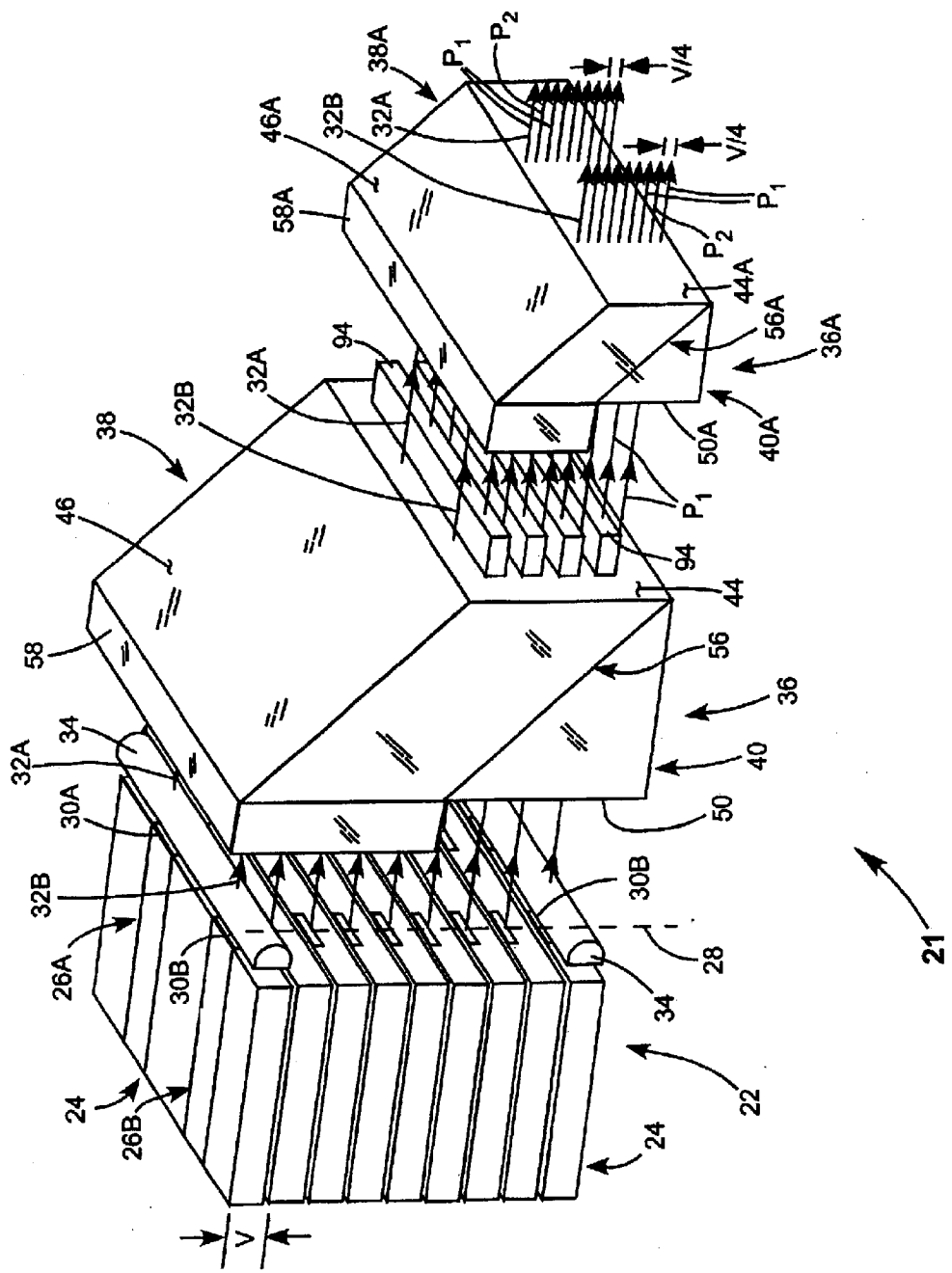
FIG. 4 is a three dimensional view schematically illustrating a third embodiment of apparatus in accordance with the present invention including a vertical stack of diode-laser bars, a plurality of polarization rotators and first and second two-element compound prisms arranged to quarter the vertical spacing of output beams of the diode-laser bars.

Referring now to FIG. 4, a third embodiment 21 of apparatus in accordance with the present invention is arranged to reduce the vertical spacing of beams emitted by a vertical stack of diode-laser bars by a factor of four. Apparatus 21 includes a stack 22 of diode-laser bars 24, cylindrical lenses 34, a half-wave plate polarization rotator 58 and a compound prism 36 cooperatively arranged to provide nine pairs 32A and 32B of parallel beams having a vertical spacing equal to one-half of the spacing of the diode-laser bars in stack 22 thereof, as described above with reference to apparatus 20 of FIGS. 1 and 2.

Four half-wave polarization rotators 94, here, in an elongated rectangular or strip form for convenience of manufacture, are arranged spaced apart and parallel to each other, adjacent to or bonded to face 44 of parallelepiped prism 38 of compound prism 36. Polarization rotators 94 are arranged to intercept only those pairs of beams polarized in orientation $P_2$ and rotate the polarization of those pairs of beams to orientation $P_1$. Beam-pairs already polarized in orientation $P_1$ pass between polarization rotators 94 with polarization orientation unchanged. As a result nine parallel beam-pairs are produced, all polarized in orientation $P_1$, with a vertical spacing therebetween of V/2, half the vertical spacing V of diode-laser bars 24 in stack 22.

The nine parallel beam-pairs are directed toward another compound prism 36A, including a parallelepiped prism component 38A and a triangular prism component 40A. Compound prism 36A is configured similarly to above described compound prism 36, with an exception that dimensions of certain features compound prism 36A are only one-half the dimensions of corresponding features of compound prism 36. Similar features of the two compound prisms are designated by like reference numerals with the features of compound prism 36A identified by a suffix A. By way of example, exit face 44A of compound prism 36A corresponds to exit face 44 of compound prism 36, reflective face 46A of compound prism 36A corresponds to reflective face 46 of compound prism 36, and so on. Prism components 38A and 40A are bonded together with an optical coating to provide an internal, polarization selective reflective surface 56A.

Five of the nine parallel-beam-pairs enter compound prism 36A through face 50A thereof. These five beams are transmitted through polarization selective reflective surface 56A and exit the compound prism via face 44A thereof. The other four of the parallel beam-pairs are transmitted by a polarization rotator 58A, which rotates the polarization plane of the beams by 90° into orientation $P_2$. The $P_2$-polarized beam-pairs undergo successive reflections from face 46A and polarization selective reflective surface 56A, and exit the compound prism via face 44A thereof. Dimensions and angles of the compound prism are selected such that the $P_2$-polarized beam-pairs exit face 44A midway between and parallel to the $P_1$-polarized beam-pairs. This provides nine pairs 32A and 32B of parallel beams having a vertical spacing V/4, i.e., one-quarter of the vertical spacing V of the diode-laser bars in stack 22 thereof.

Figure 5:
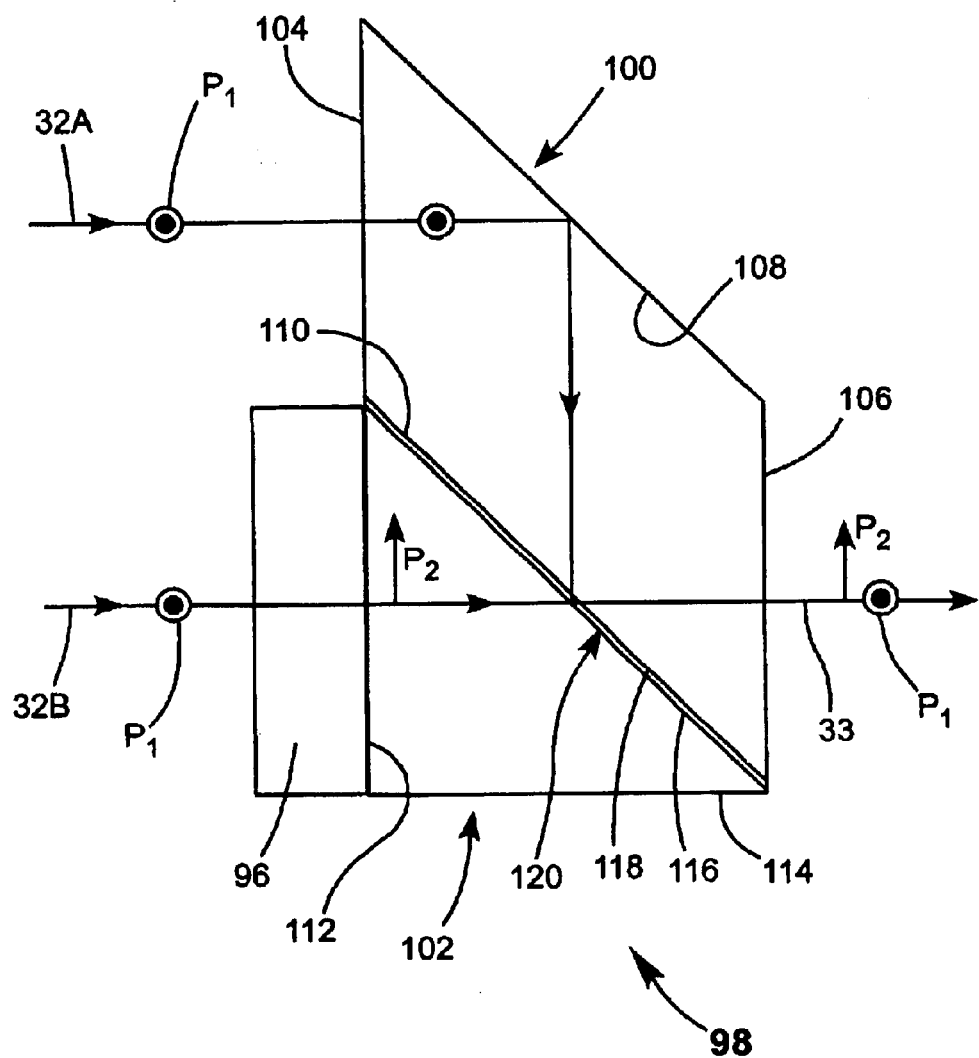
FIG. 5 is a plan view schematically illustrating a compound prism arranged to laterally overlap two horizontally spaced parallel beams from a diode-laser bar into a single beam.

In embodiments discussed above, the vertical spacing of output of beams from a vertical stack of diode-laser bars is reduced for increasing the intensity of beams as a group. Beam intensity or brightness may also be increased by overlapping horizontally spaced ones of the beams emitted by the diode-laser bar stack as depicted in FIG. 5. Here a polarization rotator 96 and a compound prism 98 are arranged to effect such a lateral overlap of beams 32A and 32B having polarization orientation $P_1$.

Compound prism 98 has a parallelepiped prism component 100 and a triangular prism component 102. Triangular prism 102 has right-angle faces 112 and 114, and a hypotenuse face 116. Hypotenuse face 116 is depicted in FIG. 1 as being at 45° to right-angle faces 112 and 114 but this should not be construed as limiting the present invention. Parallelepiped prism 100 has opposite parallel faces 104 and 106. These faces are transmissive and serve as respectively entrance and exit faces of the compound prism. Parallelepiped prism 100 also has opposite parallel faces 108 and 110. These faces are inclined at 45° and 135° to faces 104 and 106. Here again, these angles should not be construed as limiting the present invention. Face 108 is internally reflective for light incident thereon at 45°.

Face 110 of parallelepiped prism 100 and hypotenuse face 116 of triangular prism 102 are optically bonded together with a highly polarization sensitive reflecting coating 118 therebetween. Coating 118 may be deposited on either face 110 or face 116. Bonding may be effected, for example, by using an optical cement or by optically contacting the surfaces. Bonding these surfaces with the coating provides, in effect, a single internal surface 120 that is highly transmissive for radiation incident at 45° plane-polarized in orientation $P_2$. Surface 120 is highly reflective for radiation incident at 45° plane-polarized in orientation $P_1$ at 90° to orientation $P_2$.

Figure 6:
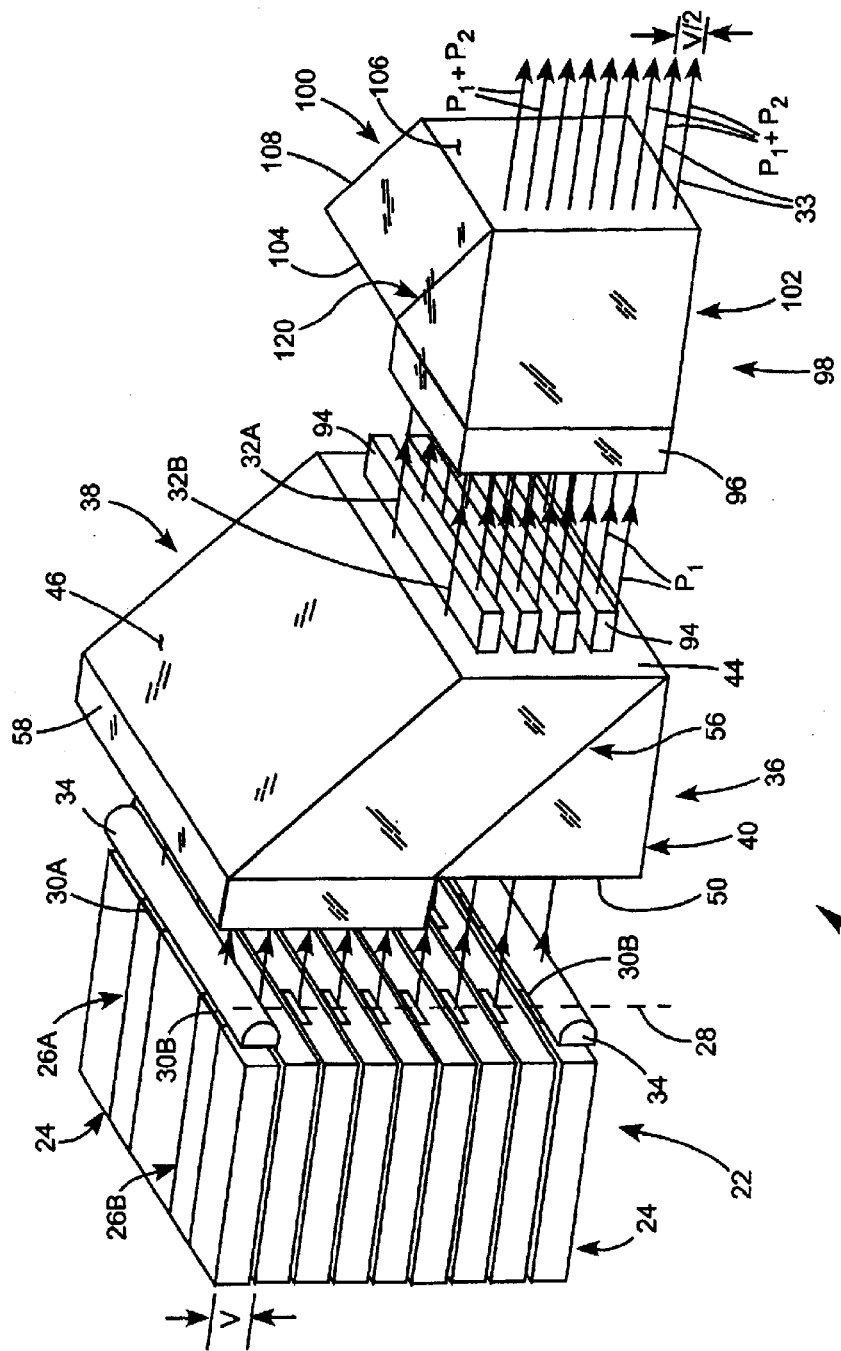
FIG. 6 is a three-dimensional view schematically illustrating a fourth embodiment of apparatus in accordance with the present invention including the apparatus of FIG. 1 arranged to half the vertical spacing of output beams of the diode-laser bars, and a plurality of polarization rotators and the compound prism of FIG. 5 arranged to overlap horizontally spaced output beams having the halved vertical spacing.

Referring now to FIG. 6, with continuing reference to FIG. 5, a fourth embodiment 23 of apparatus in accordance with the present invention includes a polarization rotator 58 and a compound prism 36 arranged to half the vertical spacing of pairs 32A and 32B of beams emitted by diode-laser bars 24 in a stack 22 thereof as discussed above with reference to FIGS. 1 and 2. Beam-pairs having the reduced vertical spacing exit face 44 of compound prism 36.

Four half-wave polarization rotators 94 are arranged spaced apart and parallel to each other, adjacent to or bonded to face 44 of parallelepiped prism 38 of compound prism 36. Polarization rotators 94 are configured and arranged as discussed above with reference to apparatus 21 of FIG. 4 to provide nine parallel beam-pairs, all polarized in orientation $P_1$, with a vertical spacing therebetween of V/2, half the vertical spacing V of diode-laser bars 24 in stack 22 thereof.

Each beam 32B is transmitted by polarization rotator 96, which rotates the polarization of the beam to orientation $P_2$. The $P_2$-polarized beams are transmitted through polarization selective reflecting surface 120, and exit compound prism 98 through face 106. Each beam 32A enters compound prism 98 through face 104, is sequentially reflected from face 108 and polarization selective reflecting surface 120 and exits compound prism 98 through face 106. Dimensions and angles of the compound prism are selected, here, such that each beam 32A exits the compound prism along the same path as, i.e., overlapped with, a corresponding beam 32B. This provides a beam 33 having both $P_1$ and $P_2$-polarized components. Accordingly apparatus 21 provides nine parallel vertically spaced beams 33, each having both $P_1$ and $P_2$-polarized components.

It should be noted here that beam dimensions and angles of compound prism 98 may be selected cooperative with horizontal spacing H such that beams 32A and 32B do not overlap on exiting the compound prism, but merely have the horizontal spacing therebetween reduced. Overlapping beams, of course, have horizontal spacing thereof reduced to zero. It should also be noted that diode-laser bars may include more emitters and thereby emit more beams than diode-laser bars 24. Diode-laser bars may include as many as fifty emitters. Those skilled in that art will recognize that a compound prism such as prism 98 could overlap four horizontally spaced beams to provide two compound beams, six horizontally spaced beams to provide three compound beams, and so on. An extensive description of beam overlapping using compound prisms such as prism 98 is provided in copending application Ser. No. 10/266,066 filed Oct. 7, 2002, the complete disclosure of which is hereby incorporated by reference.

Figure 7:
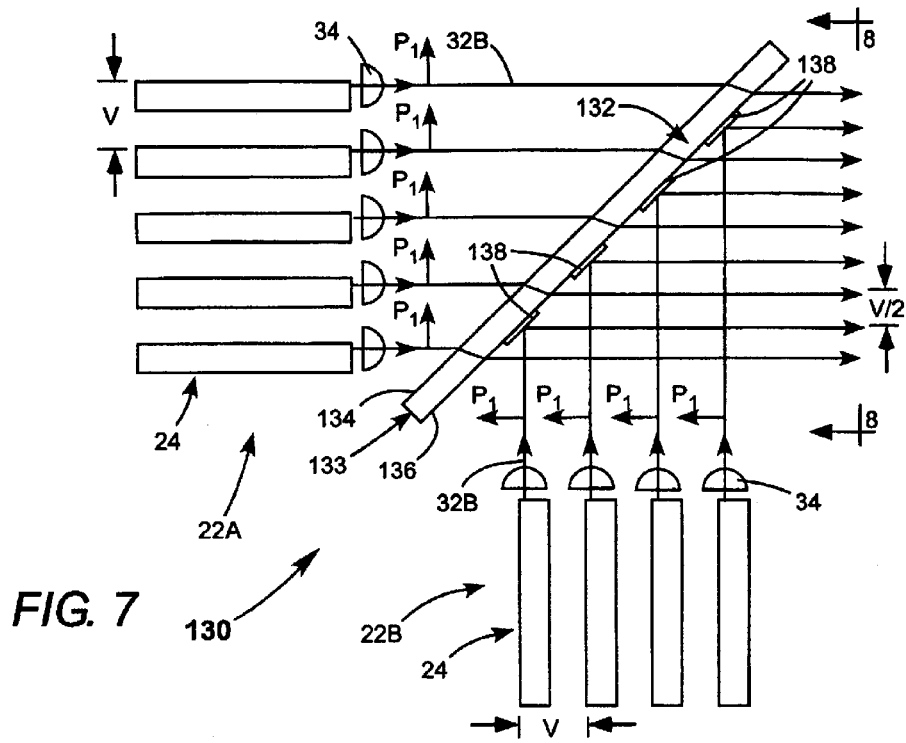
FIG. 7 is a side elevation view schematically illustrating a fifth embodiment of apparatus in accordance with the present invention including two stacks of diode-laser bars having the same spacing therebetween, and a beam combiner including spaced apart reflective strips for combining output beams from the diode-laser bars into a parallel set of beams having a vertical spacing therebetween equal to one-half the spacing of the diode-laser bars.
Figure 8:
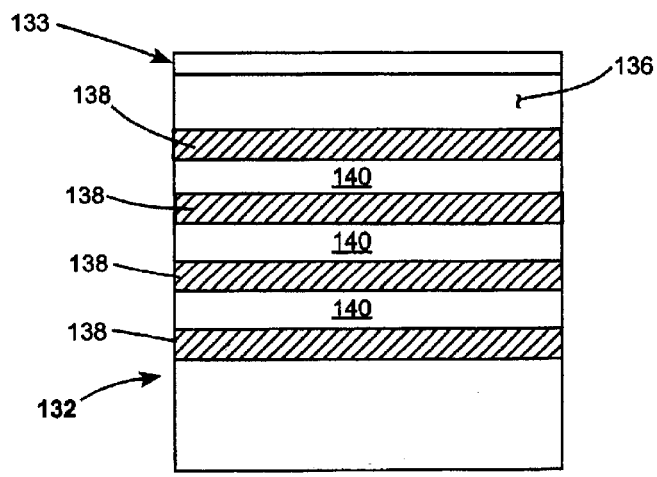
FIG. 8 is a front elevation view, seen generally in the direction 8—8 of FIG. 7, schematically illustrating details of the beam combiner of FIG. 7.

Referring now to FIG. 7 and FIG. 8, a fifth embodiment 130 of apparatus in accordance with the present invention includes two stacks 22A and 22B of respectively five and four, diode-laser bars 24. Emitters (not shown) in each stack, here, emit parallel pairs of beams polarized in orientation $P_1$.

Only one beam 32B from each bar is visible in FIG. 7. The spacing of diode-laser bars 24 in each stack is the same, here equal to V. Stack 22B emits beams in a direction at 90° to the direction of beams emitted by stack 22A. Beams from each stack are collimated in the fast-axis direction by cylindrical microlenses 34.

Beams emitted by each stack are directed toward a beam combiner 132 on a substrate 133 having opposite surfaces 134 and 136. Beams from each of stacks 22A and 22B are incident on beam combiner 132 at 45° to the emission direction of the beams. Each of surfaces 134 and 136 preferably includes an antireflection coating (not shown) arranged to provide minimum reflection at the wavelength of the diode-laser beams in the polarization-orientation of the beams, here orientation $P_1$. Deposited on surface 136 and forming beam combiner 132 are four parallel, elongated reflective strips 138 separated by spaces 140 (see FIG. 8). Surface 136 here, defines a beam combiner plane. Strips 138 preferably having greater than 99% reflection for the wavelength of the diode-laser beams in the polarization-orientation of the beams. Reflective strips 138 are preferably sufficiently wide to intercept (at 45° incidence) the full height of a collimated beam from a diode-laser bar 24, and preferably spaced apart sufficient that such a beam can pass (again at 45° incidence) unvignetted through a space 140.

Beam combiner 132 is arranged with respect to diode-laser bar stack 22A such that, of the five beam-pairs emitted by the stack, outermost ones thereof are transmitted through the beam combiner, with one passing under and the other over reflective strips 138. The remaining three beam-pairs are transmitted through the beam combiner via a corresponding space 140 between the reflective strips. Beam combiner 132 is arranged with respect to diode-laser bar stack 22B such that the four beam-pairs emitted by the stack are intercepted by reflective strips 138 and reflected by the reflective strips parallel to and midway between beams transmitted through the strips. This provides vertically aligned, parallel beams having a vertical spacing V/2 (half the diode-laser bar spacing V) with all beams having the same polarization orientation.

It should be noted here that the selection of a 45° incidence angle for beam combiner 132 should not be construed as limiting the invention. Other incidence angles may be selected without departing from the spirit and scope of the present invention. Brewster angle incidence may be found convenient for beams polarized in orientation $P_1$ (in the plane of incidence). This minimizes reflection from the surfaces without the use of an antireflection coating. Incidence angles on front and rear surfaces may be different if surfaces 134 and 136 are inclined with respect to each other.

Figure 7A:
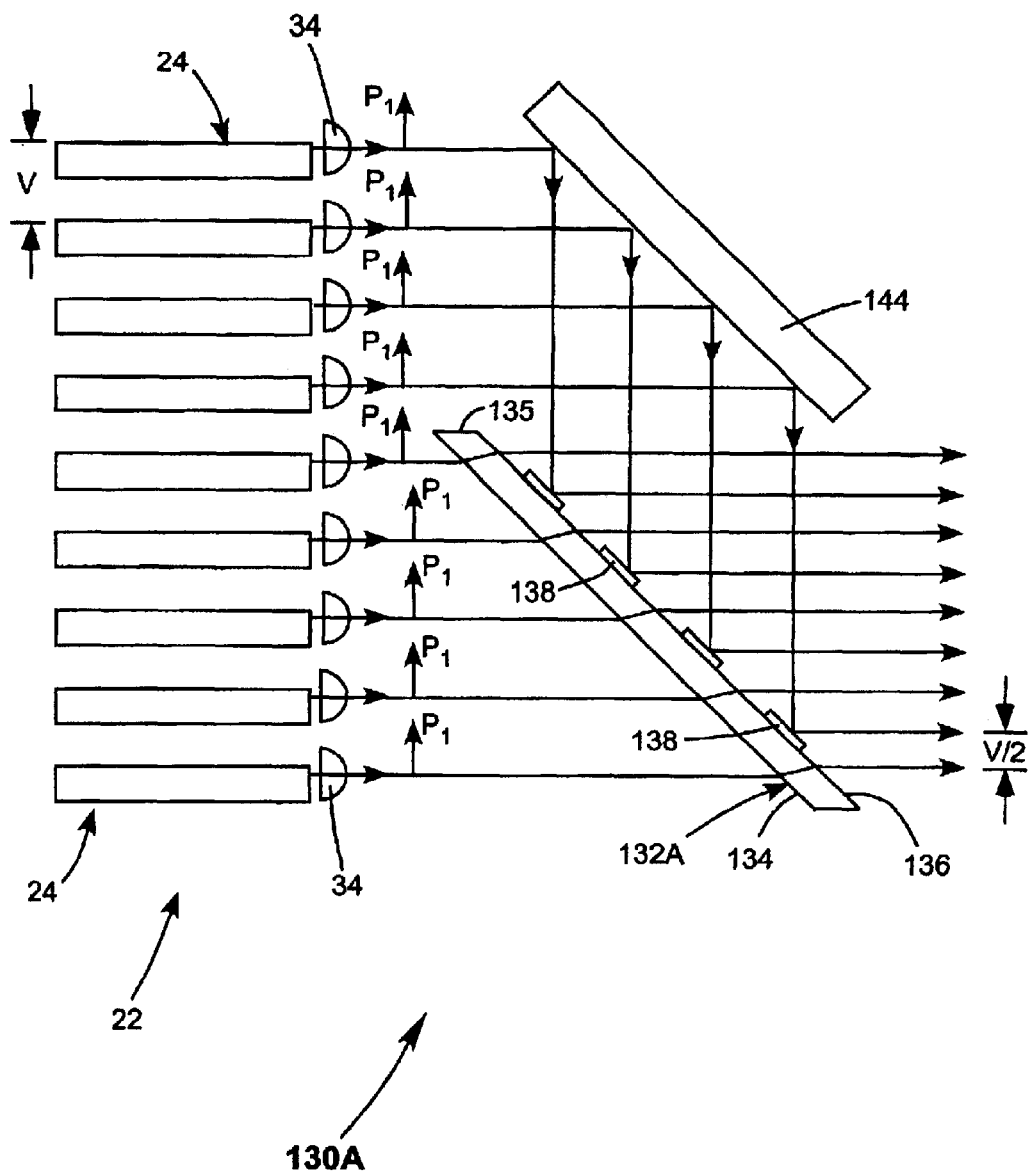
FIG. 7A is a side elevation view schematically illustrating apparatus in accordance with the present invention including the beam combiner of FIG. 7 with only one stack of diode-laser bars and a mirror cooperative with the beam combiner for combining output beams from the diode-laser bars into a parallel set of beams having a vertical spacing therebetween equal to one-half the spacing of the diode-laser bars.

FIG. 7A schematically illustrates a variation 130A of apparatus 30. Here, the apparatus includes only one stack 22 of diode-laser bars 24. The apparatus includes a beam combiner 132A similar to beam combiner 132 but wherein at least one edge 135 thereof is beveled to avoid vignetting output beams from the diode-laser bars. Beams from the diode laser bars to be reflected from reflective strips 138 of the beam combiner are reflected by a mirror 144 onto the beam combiner.

Figure 7B:
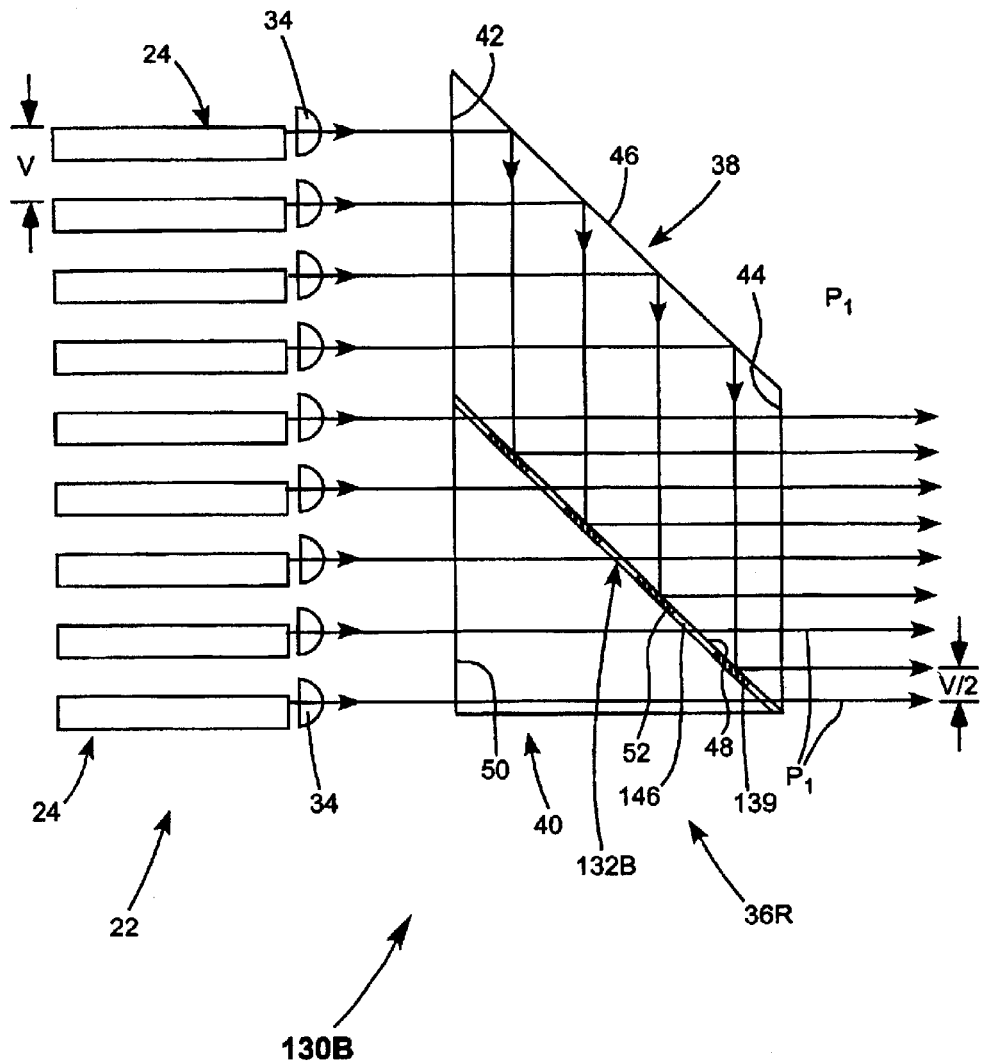
FIG. 7B is a side elevation view schematically illustrating apparatus in accordance with the present invention similar to the apparatus of FIG. 7A but wherein the beam combiner including reflective strips is incorporated in a compound prism.

FIG. 7B schematically illustrates a variation 130B of apparatus 130A. Here a beam combiner 132B is formed at a bonded interface between a parallelpiped prism 38 and a triangular prism 40 forming a compound prism 36R similar to compound prism 36 of apparatus 20 except for the bonded interface arrangement. In compound prism 37R reflective strips 139 (corresponding reflective strips 138 of apparatus 130A) are deposited on either face 52 of triangular prism 40, or on face 48 of parallelepiped prism 38, before the faces are bonded together by a transparent adhesive layer 146. Beam combiner 132B essentially comprises the reflective strips and the transparent adhesive filling spaces 40 therebetween. The beam combiner plane is defined by the interface. Face 46 of parallelepiped prism directs beams onto the reflective strips by total internal reflection.

Whether the radiation emitted by the diode-laser bars is polarized in orientation $P_1$ or in orientation $P_2$, it is advantageous to make strips 139 highly reflective for both orientations. By way of example an "enhanced metal" reflective coating including twenty-two layers alternating $Al_2O_3$ and ZnSe on a gold layer, with layers optimized in thickness for 45° incidence in the prism material, will provide about 99.9% reflection for $P_1$-polarized radiation and 99.99% or greater for $P_2$-polarized radiation with prism material (and adhesive) having a refractive index of about 1.52. Such a coating minimizes potential losses due to possible polarization impurity in diode-laser output beams, either inherent, or induced by possible stress birefringence effects in the compound prism.

Figure 7C:
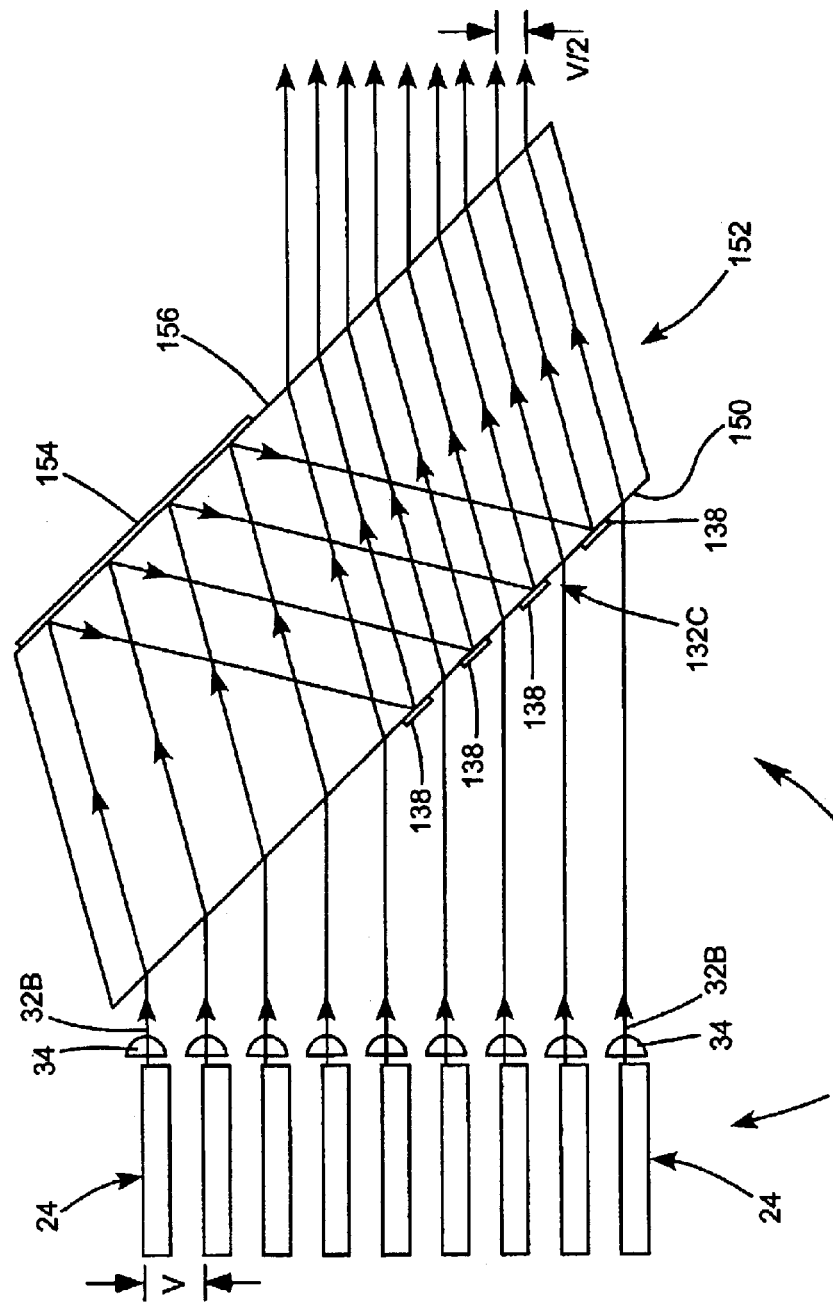
FIG. 7C is a side elevation view schematically illustrating apparatus in accordance with the present invention similar to the apparatus of FIG. 7A but wherein the beam combiner including reflective strips is supported on an entrance surface of a slab of transparent material, the slab having a mirror on a portion of a second surface parallel to the first surface.

FIG. 7C schematically illustrates a variation 130C of apparatus 130A. Here a beam combiner 132C comprising parallel, spaced-apart reflective strips 138 is formed on a lower portion of an entrance surface 150 of a slab 152 of a transparent material. surface 150 defines the beam combiner plane. A reflector 154 is formed on an upper portion of an exit face 156 of slab 52. Surfaces 150 and 156 are parallel to each other and are inclined to the propagation direction of beams 32B from diode-lasers 24. Here, the angle is depicted as being 45°. This should not, however, be considered as limiting the invention. Reflective strips 138 and mirror 154 are arranged and aligned with diode-laser bars 24 such that beams from five of the diode-laser bars enter the slab 152 via surface 150, proceed directly to surface 156, and exit the slab via surface 156. Three of the beams from the five diode-laser bars pass between the strips, and the other two pass around the strips. Beams from four other of the diode laser bars also enter slab 152 via surface 150. These beams, however, are intercepted by mirror 154 and are reflected thereby onto reflective strips 138. The beams are reflected by reflective strips 138 out of slab 152 via exit face 156 thereof parallel to the beams that have been directly transmitted through the slab without being reflected by mirror 154. The five directly transmitted beams and the four twice-reflected beams leave the slab parallel to each other and spaced apart by a distance V/2.

Figure 9:
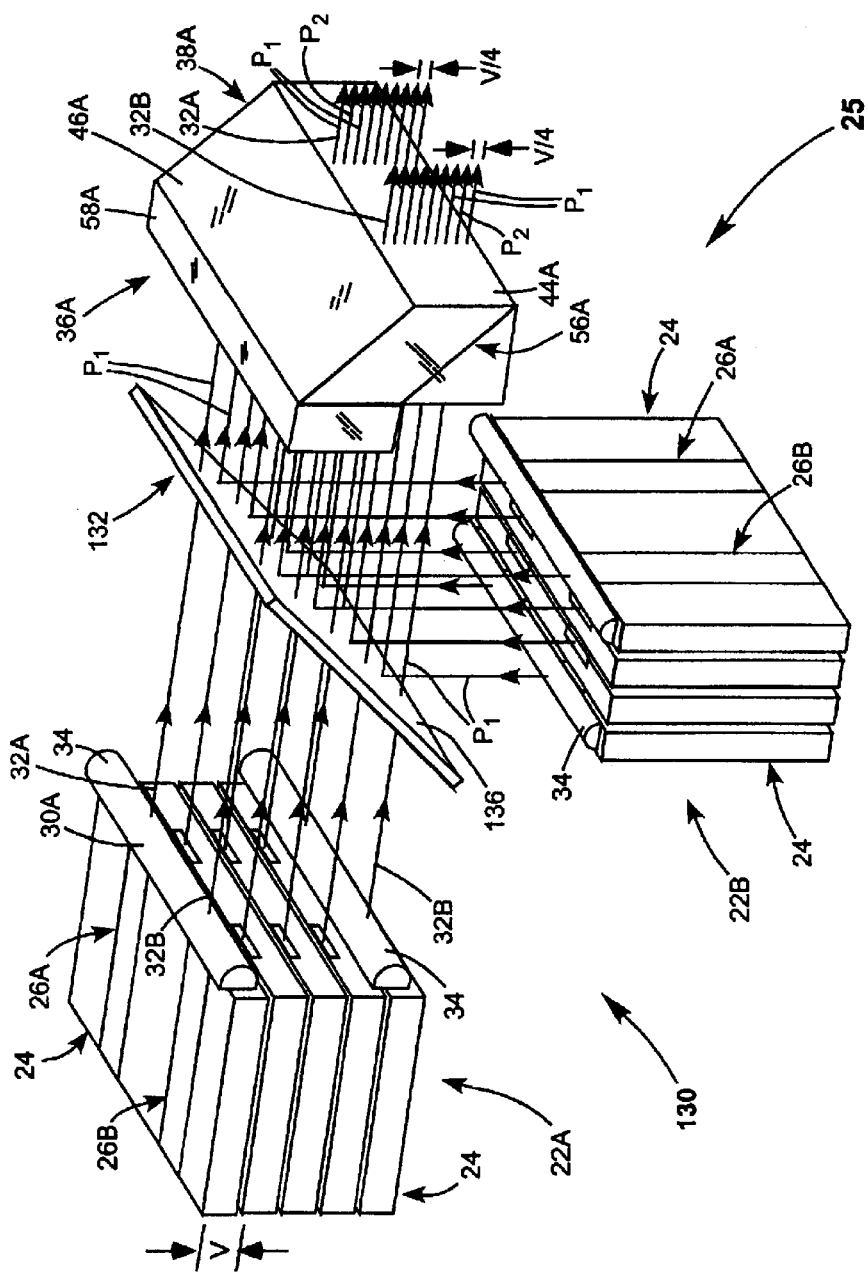
FIG. 9 is a three-dimensional view schematically illustrating a sixth embodiment of apparatus in accordance with the present invention comprising the apparatus of FIG. 7, including the two stacks of diode-laser bars having the same spacing therebetween and the beam combiner including spaced apart reflective strips, cooperative with a polarization rotator and the second compound prism of the apparatus of FIG. 4 for combining output beams from the diode-laser bars thereby forming the output beams into a parallel set of beams having a vertical spacing therebetween equal to one-quarter the spacing of the diode-laser bars.
Figure 10:
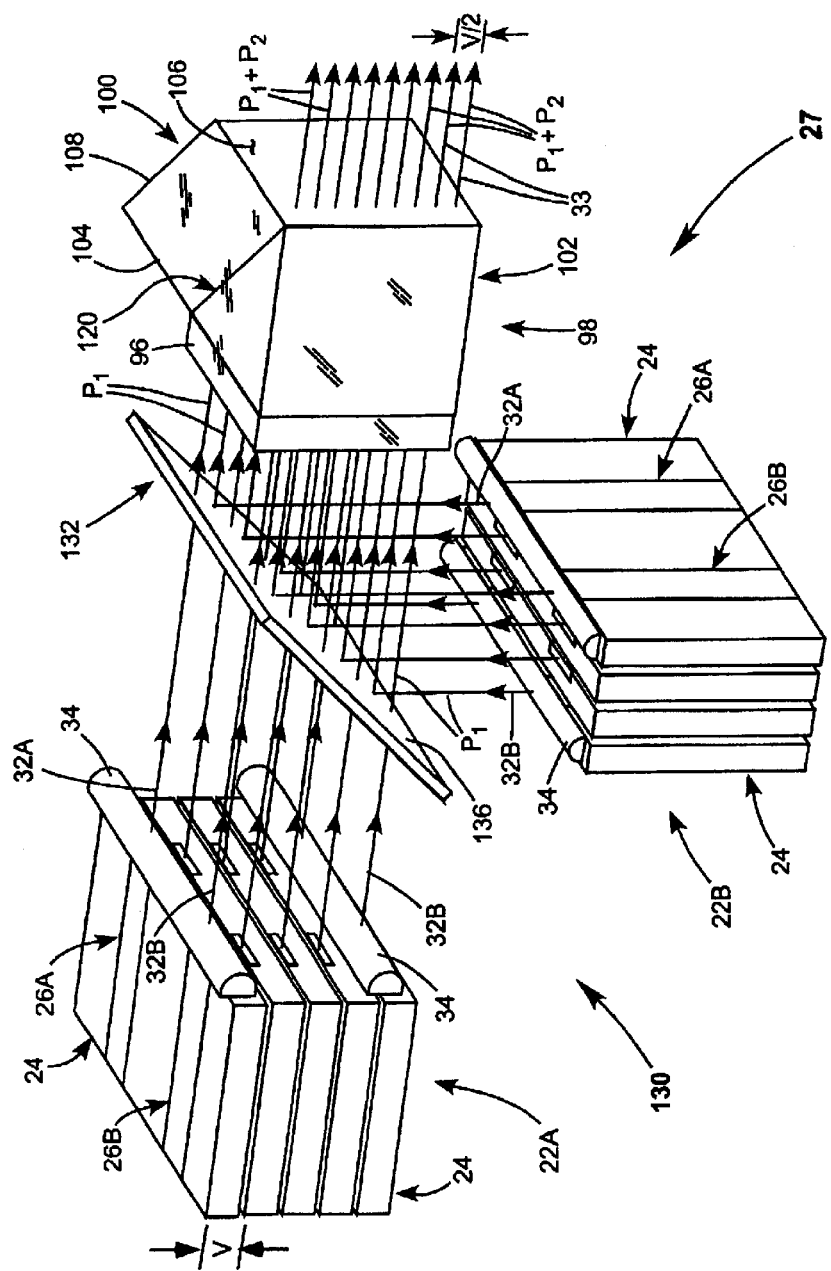
FIG. 10 is a three-dimensional view schematically illustrating a seventh embodiment of apparatus in accordance with the present invention including the apparatus of FIG. 7, including the two stacks of diode-laser bars having the same spacing therebetween and the beam combiner including spaced apart reflective strips, cooperative with a polarization rotator and the compound prism of FIG. 5 for combining output beams from the diode-laser bars and overlapping horizontally spaced ones of the combined beams.

An advantage of apparatus 130, 130A, 130B and 130C compared with other embodiments of the inventive apparatus described above is that the halving of the beam spacing from the diode-laser bar stacks is accomplished without a need to change, even once, the polarization orientation of any of the beams. All of these apparatus are operable independent of the polarization orientation of the beams. A disadvantage of apparatus 130 (FIG. 7) is that two diode-laser bar stacks must be provided, and aligning the two diode-laser bar stacks and the beam combiner may prove somewhat more difficult than aligning one diode-laser bar stack with a compound prism such as compound prism 36 of FIGS. 1 and 2. A disadvantage of apparatus 130a (FIG. 7a) is that mirror 144 and beam combiner 132A must be independently aligned. Nevertheless, providing vertically aligned, parallel beams having the same polarization orientation makes any apparatus 130, 130A, 130B, or 130C convenient to combine with an above-discussed compound prism 36A for further reducing the vertical spacing of beams, or with an above-discussed compound prism 98 for overlapping horizontally spaced beams. A description of two such combinations is set forth below with reference to FIG. 9 and FIG. 10 FIG. 9 depicts a sixth embodiment 25 of apparatus in accordance with the present invention. Apparatus 25 comprises a beam combining apparatus 130 including a stack 22A of five two-emitter diode-laser bars 24, and a stack 22B of four two-emitter diode-laser bars 24. Each stack has a diode-laser bar spacing V. Each diode-laser bar 24 emits a beam-pair including beams 32A and 32B polarized in orientation $P_1$. Beam combiner 132 combines the beam-pairs from the two stacks as discussed above such that nine parallel beam-pairs polarized in orientation $P_1$ and having a vertical spacing V/2 leave beam combiner 132. The nine beam-pairs are directed to a compound prism 36A configured as described above with reference to apparatus 21 of FIG. 4.

Five of the nine parallel beam-pairs enter compound prism 36A through face 50A thereof. These five beam-pairs are transmitted through a polarization selective reflective surface 56A and exit the compound prism via face 44A thereof. The other four of the parallel beam-pairs are transmitted by a polarization rotator 58A, which rotates the polarization plane of the beam-pairs into orientation $P_2$. The $P_2$-polarized beam-pairs undergo successive reflections from face 46A and polarization selective reflective surface 56A and exit the compound prism via face 44A thereof. Dimensions and angles of the compound prism are selected such that the $P_2$-polarized beam-pairs exit face 44A midway between and parallel to the $P_1$-polarized beam-pairs as depicted. This provides nine pairs 32A and 32B of parallel beams having a vertical spacing V/4, i.e., one-quarter of the vertical spacing V of the diode-laser bars in stacks 22A and 22B thereof.

FIG. 10 depicts a seventh embodiment 27 of apparatus in accordance with the present invention. Apparatus 27 comprises a beam combining apparatus 130 including a stack 22A of five two-emitter diode-laser bars 24, a stack 22B of four two-emitter diode-laser bars 24, and beam combiner 132. Nine beam-pairs 32A and 32B leave the beam combiner and are directed to a compound prism 98 configured as described above with reference to apparatus 23 of FIG. 6.

Each beam 32B is transmitted by polarization rotator 96, which rotates the polarization of the beam to orientation $P_2$. The $P_2$-polarized beams are transmitted through polarization selective reflecting surface 120 and exit compound prism 98 through face 106. Each beam 32A enters compound prism 98 through face 104, is sequentially reflected from face 108 and a polarization selective reflecting surface 120, and exits compound prism 98 through face 106. Dimensions and angles of the compound prism are selected such that each beam 32A exits the compound prism along the same path as, i.e., overlapped with, a corresponding beam 32B. This provides a beam 33 having both $P_1$ and $P_2$-polarized components. Accordingly apparatus 27 provides nine parallel, vertically spaced beams 33, having a vertical spacing V/2, and each having both $P_1$ and $P_2$-polarized components.

In all embodiments of the present invention discussed above, diode-laser bars have been assumed to emit light polarized in an orientation $P_1$, wherein the electric vector is parallel to the fast-axis of emitters in the diode-laser bar. Those familiar with the art will be aware that diode-laser bars that emit light polarized in orientation $P_2$ (at 90 to orientation P1), wherein the electric vector is parallel to the slow-axis of emitters in the diode-laser bar, are also commercially available. All above discussed embodiments, except apparatus 130 of FIG. 7, would require a minor reconfiguration to accommodate diode-laser bars emitting $P_2$-polarized radiation. Such a reconfiguration is discussed below with reference to FIG. 11.

Figure 11:
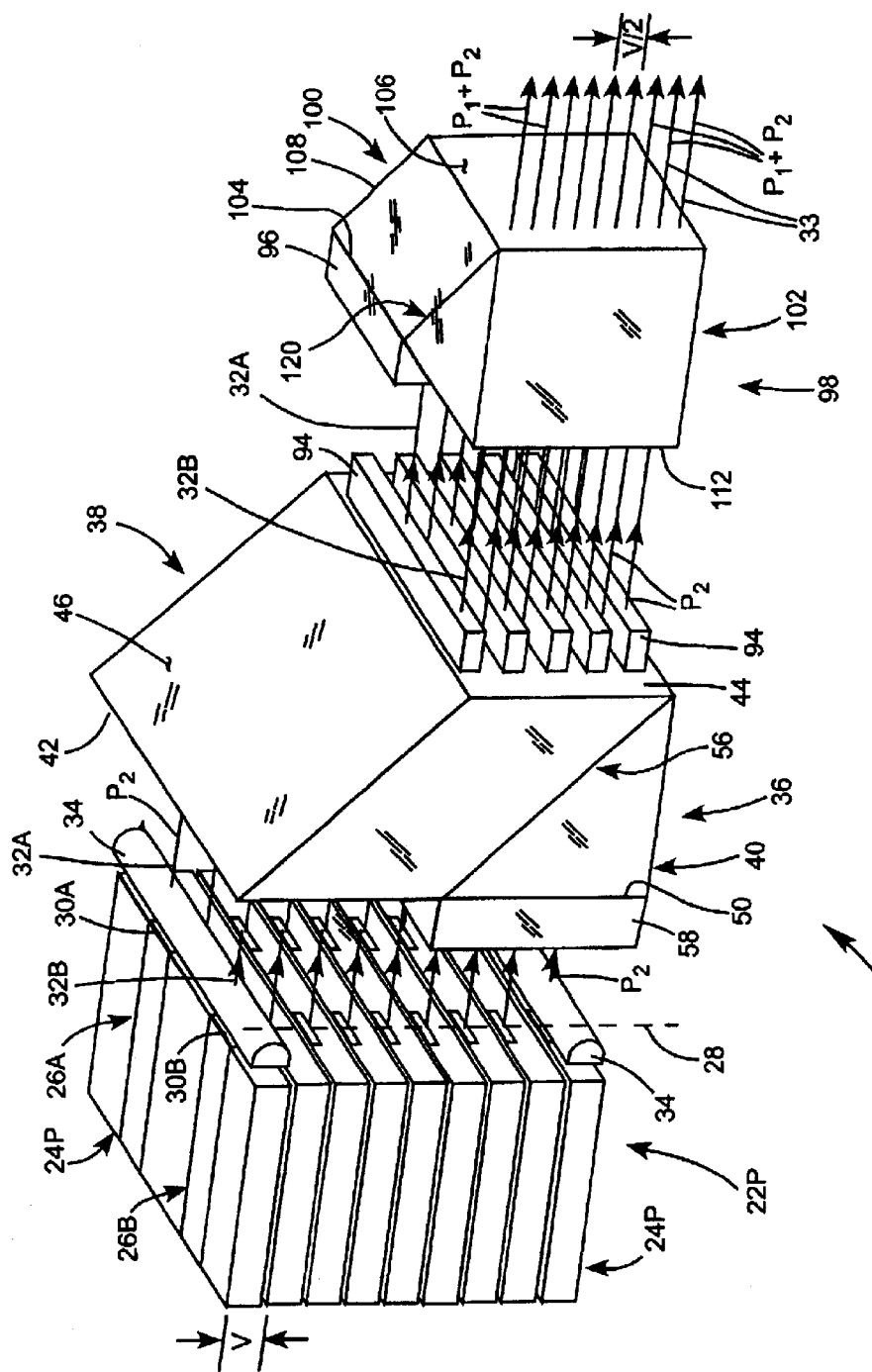
FIG. 11 is a three-dimensional view schematically illustrating an eighth embodiment of apparatus in accordance with the present invention similar to the apparatus of FIG. 6, but wherein diode-laser bars emit light that is polarized in an orientation at 90° to the polarization orientation of light emitted by the diode-laser bars of FIG. 6.

FIG. 11 schematically depicts an eighth embodiment 29 of apparatus in accordance with the present invention. Apparatus 29 is configured to achieve the same result as the apparatus 23 of FIG. 6. In apparatus 29, a diode-laser bar stack 22P including diode-laser bars 24P emitting radiation polarized in orientation $P_2$ is substituted for diode-laser bar stack 24 of apparatus 23 wherein diode-laser bars 24 emit radiation polarized in orientation $P_1$. The different polarization orientation is accommodated by changing the position of polarization rotators with respect to compound prisms, such that apparatus 29 functions as follows.

Five pairs 32A and 32B of beams polarized in orientation $P_2$ are transmitted through polarization rotator 58, which rotates the polarization orientation of the beams into orientation $P_1$. The $P_1$-polarized beams enter compound prism 36 through face 50 of triangular prism component 40 of the compound prism, are transmitted through polarization selective reflecting surface 58, and exit the compound prism via face 44 of parallelepiped prism component 38 of the compound prism.

Four beam-pairs polarized in orientation $P_2$ are reflected from face 46 of parallelepiped prism 38 and then reflected from polarization selective reflecting surface 56 of compound prism 36. After reflection from surface 56 the $P_2$-polarized beams exit compound prism 36 via face 44 of parallelepiped prism component 38 of the compound prism. The dimensions of compound prism 36 are selected, cooperative with the angles at which component prism faces are inclined, such that each $P_2$-polarized beam leaves the compound prism parallel to and midway between two $P_1$-polarized beams.

Five half-wave polarization rotators 94 are arranged spaced apart and parallel to each other, adjacent to or bonded to face 44 of parallelepiped prism 38 of compound prism 36. Polarization rotators 94 rotate the polarization of $P_1$-polarized beams to orientation $P_2$, thereby providing nine parallel beam-pairs, all polarized in orientation $P_2$, with a vertical spacing therebetween of V/2. The nine $P_2$-polarized beam-pairs are then directed to a compound prism 98.

Before reaching the compound prism, each beam 32A is transmitted by polarization rotator 96, which rotates the polarization of the beam to orientation $P_1$. The $P_1$-polarized beams then enter compound prism 98 and are sequentially reflected from face 108 and polarization selective reflecting surface 120 and exit compound prism 98 through face 106. Each beam 32B enters compound prism 98 via face 112, is transmitted through polarization selective reflecting surface 120, and exits compound prism 98 through face 106. Dimensions and angles of the compound prism are selected such that each beam 32A exits the compound prism along the same path as, i.e., overlapped with, a corresponding beam 32B. This provides nine parallel, vertically spaced beams 33, each having both $P_1$ and $P_2$-polarized components.

In one possible variation of apparatus 29, four, rather than five, polarization rotators 94 could be deployed to rotate the polarization of $P_2$-polarized beams to $P_1$-polarized beams. This would direct nine $P_1$-polarized beam-pairs toward compound prism 98. In this case, it would be necessary to relocate polarization rotator 96 from its position adjacent face 104 of the compound prism to a position adjacent face 112 of the compound prism.

Figure 12:
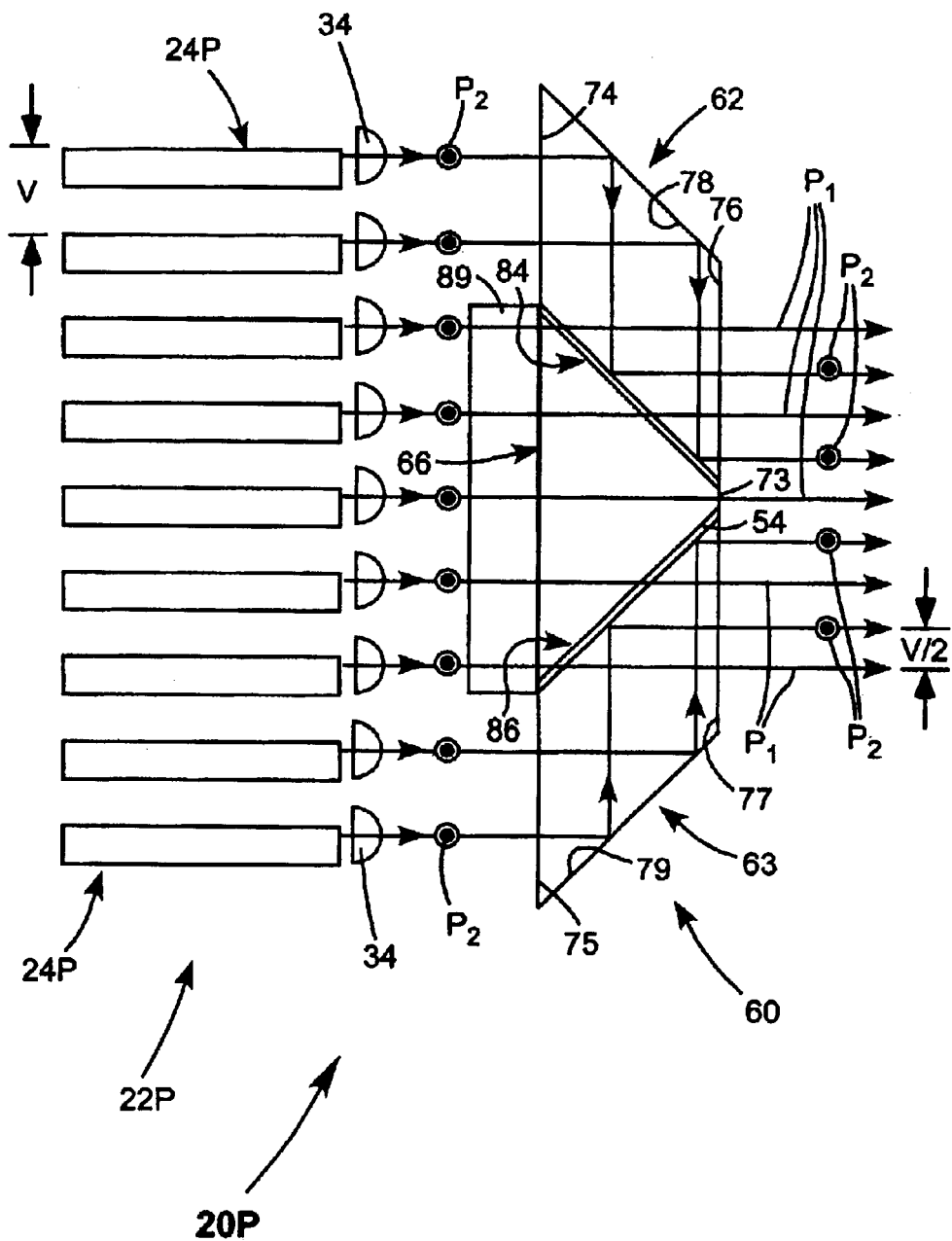
FIG. 12 is a side elevation view schematically illustrating a ninth embodiment of apparatus in accordance with the present invention, similar to the apparatus of claim 3, but wherein diode-laser bars emit light polarized in a different orientation and the apparatus includes only one polarization rotator.

FIG. 12 schematically illustrates a ninth embodiment 20P of apparatus in accordance with the present invention.

Apparatus 20P is similar to apparatus 20A of FIG. 3 with an exception that diode-laser bar stack 22 is replaced by a diode-laser bar stack 22P emitting beams polarized in orientation $P_2$ as discussed above with reference to FIG. 11. Further the two polarization rotators 88 and 90 of apparatus 20A are replaced with a single polarization rotator 89 located adjacent isosceles prism component 66 of compound prism 60. Polarization rotator 89 rotates the polarization orientation of $P_2$-polarized beams to orientation $P_1$. This allows the polarization-rotated beams to be transmitted by polarization selective surfaces 84 and 86. $P_2$-polarized that are not polarization rotated are twice reflected from surfaces 78 and 84 and 79 and 86.

From the foregoing description, those skilled in the art will recognize how other above described embodiments can be reconfigured to accommodate $P_2$-polarized diode-lasers without departing from the spirit and scope of the present invention. Those skilled in the art will also recognize that all above-discussed embodiments are applicable to diode-laser bar stacks including diode-laser bars having more than two emitters. In all above discussed embodiments beams from nine diode laser bars are combined to reduce spacing, with beams from five thereof transmitted and from four thereof twice reflected. Those skilled in the art will recognize there may be more or less diode-laser bars in a stack with, generally, beams from M diode-laser bars interleaved with beams from N diode laser bars, where M may be equal to N+1 or where M and N may be equal.

In summary, the present invention is described above in terms of a preferred and other embodiments. The invention is not limited, however, to the embodiments described and depicted. Rather, the invention is limited only by the claims appended hereto.

What is claimed is:

1. Apparatus, comprising:

a plurality M+N of diode-laser bars, each thereof emitting at least one beam of radiation plane-polarized in one of a first and a second polarization orientation, said polarization orientations being at ninety degrees to each other, and said diode-laser bars being selected and arranged such that all beams emitted thereby are polarized in the same polarization orientation, are parallel to each other, and are spaced a first distance apart;

a first polarization rotator arranged to rotate the polarization plane of beams having one of said first and second polarization orientations by ninety degrees;

a compound prism having a first, total reflecting surface and a second, polarization-selective surface, said second surface being highly transmissive for radiation plane-polarized in said first polarization orientation and highly reflective for radiation plane-polarized in said second polarization orientation, said first and second surfaces being parallel to each other;

wherein, if said beams emitted by diode-laser bars are plane-polarized in said first polarization orientation, said first polarization rotator, and said compound prism are configured and arranged such that a beam from at least one of said N diode-laser bars has the polarization-orientation thereof rotated by said first polarization-rotator and is transmitted through said compound prism via sequential reflections from said first and second surfaces, and such that a beam from at least one said M diode-laser bars is transmitted through said compound prism transmission via transmission through said second surface;

wherein, if said beams emitted by diode-laser bars are plane-polarized in said second polarization orientation, said first polarization rotator, and said compound prism are configured and arranged such that a beam from at least one of said N diode-laser bars is transmitted through said compound prism via sequential reflections from said first and second surfaces, and such that a beam from at least one said M diode-laser bars has the polarization-orientation thereof rotated by said first polarization-rotator and is transmitted through said compound prism via transmission through said second reflecting surface; and wherein said plurality of diode-laser bars and said compound prism are configured such that adjacent ones of said transmitted beams exit said compound prism parallel to each other, and spaced apart by a second distance less than said first distance.

2. The apparatus of claim 1, wherein said second distance is one-half said first distance.

3. The apparatus of claim 1, wherein said adjacent ones of said beams exiting said compound have opposite polarization orientations.

4. The apparatus of claim 1, wherein said first and second surfaces of said compound prism are inclined at 45 degrees to the propagation direction of said beams.

5. The apparatus of claim 1, wherein if said beams emitted by diode-laser bars are plane-polarized in said first polarization orientation, said polarization rotator, and said compound prism are configured and arranged such that a beam from each of said N diode-laser bars has the polarization-orientation thereof rotated by said polarization-rotator and is transmitted through said compound prism via sequential reflections from said first and second surfaces, and such that a beam from each of said M diode-laser bars is transmitted through said compound prism via transmission through said second reflecting surface; and wherein, if said beams emitted by said diode-laser bars are plane-polarized in said second polarization orientation, said polarization rotator, and said compound prism are configured and arranged such that a beam from each of said N diode-laser bars is transmitted through said compound prism via sequential reflections from said first and second surfaces, and such a beam from each said M diode-laser bars has the polarization-orientation thereof rotated by said polarization-rotator and is transmitted through said compound prism via transmission through said second reflecting surface.

6. The apparatus of claim 5, wherein M=N+1.

7. The apparatus of claim 6, wherein N=4.

8. The apparatus of claim 1, wherein, said diode-laser bars emit beams plane-polarized in said first polarization orientation; wherein the apparatus further includes a second polarization rotator arranged to rotate the polarization plane of beams having one of said first and second polarization orientations by ninety degrees; wherein said compound prism further includes a third, total reflecting surface and a fourth, polarization-selective surface, said fourth surface being highly transmissive for radiation plane-polarized in said first polarization orientation and highly reflective for radiation plane-polarized in said second polarization orientation, said third and fourth surfaces being parallel to each other; and wherein said second polarization rotator, and said compound prism are configured and arranged such that a beam from at least one of said N diode-laser bars has the polarization-orientation thereof rotated by said second polarization-rotator and is transmitted through said compound prism via sequential reflections from said third and fourth and second surfaces, and such that a beam from at least one said M diode-laser bars is transmitted through said compound prism via transmission through said fourth reflecting surface.

9. The apparatus of claim 8, wherein said diode-laser bars and said compound prism are configured such that a beam from one of said M said diode-laser bars is transmitted through said compound prism without being transmitted by or reflected by any of said first, second, third, and fourth surfaces.

10. The apparatus of claim 9, wherein N is even; wherein a beam from each of N/2 said diode-laser bars has the polarization-orientation thereof rotated by said first polarization-rotator and is transmitted through said compound prism via sequential reflections from said first and second surfaces, and a beam from each of N/2 said diode-laser bars is transmitted through said compound prism via transmission through said second reflecting surface.

11. The apparatus of claim 10, wherein a beam from each of N/2 said diode-laser bars has the polarization-orientation thereof rotated by said second polarization-rotator and is transmitted through said compound prism via sequential reflections from said third and fourth surfaces, and a beam from each of N/2 said diode-laser bars is transmitted through said compound prism transmission via transmission through said fourth reflecting surface.

12. The apparatus of claim 1, wherein, said diode-laser bars emit beams plane-polarized in said second polarization orientation; wherein said compound prism further includes a third, total reflecting surface and a fourth, polarization-selective surface, said fourth surface being highly transmissive for radiation plane-polarized in said first polarization orientation and highly reflective for radiation plane-polarized in said second polarization orientation, said third and fourth surfaces being parallel to each other; and wherein said first polarization rotator, and said compound prism are configured and arranged such that a beam from at least one of said N diode-laser bars is transmitted through said compound prism via sequential reflections from said third and fourth and second surfaces, and such that a beam from at least one of said M diode-laser bars has the polarization orientation thereof rotated by said first polarization rotator and is transmitted through said compound prism via transmission through said fourth reflecting surface.

13. The apparatus of claim 12, wherein said diode-laser bars and said compound prism are configured such that a beam from one of said M said diode-laser bars has the polarization orientation thereof rotated by said first polarization rotator and is transmitted through said compound prism without being transmitted by or reflected by any of said first, second, third, and fourth surfaces.

14. The apparatus of claim 13, wherein N is even; wherein a beam from each of N/2 said diode-laser bars is transmitted through said compound prism via sequential reflections from said first and second surfaces, and a beam from each of N/2 said diode-laser bars has the polarization-orientation thereof rotated by said first polarization-rotator and is transmitted through said compound prism via transmission through said second reflecting surface.

15. The apparatus of claim 14, wherein a beam from each of N/2 said diode-laser bars is transmitted through said compound prism via sequential reflections from said third and fourth surfaces, and a beam from N/2 said diode-laser bars has the polarization-orientation thereof rotated by said first polarization-rotator and is transmitted through said compound prism transmission via transmission through said fourth reflecting surface.

16. Apparatus, comprising:
a plurality M+N of diode-laser bars, each thereof emitting at least one beam of radiation plane-polarized in one of a first and a second polarization orientation, said polarization orientations being at ninety degrees to each other, and said diode-laser bars being selected and arranged such that all said beams emitted thereby are polarized in the same polarization orientation, are parallel to each other, and are spaced a first distance apart;

a first polarization rotator arranged to rotate the polarization plane of beams having one of said first and second polarization orientations by ninety degrees;

a compound prism having a first, total reflecting surface and a second, polarization-selective surface said second surface being highly transmissive for radiation plane-polarized in said first polarization orientation and highly reflective for radiation plane-polarized in said second polarization orientation, said first and second surfaces being parallel to each other;

wherein, if said beams emitted by diode-laser bars are plane-polarized in said first polarization orientation, said first polarization rotator, and said compound prism are configured and arranged such that a beam from at least one of said N diode-laser bars has the polarization-orientation thereof rotated by said first polarization-rotator and is transmitted through said compound prism via sequential reflections from said first and second surfaces, and such that a beam from at least one said M diode-laser bars is transmitted through said compound prism via transmission through said second surface;

wherein, if said beams emitted by diode-laser bars are plane-polarized in said second polarization orientation, said first polarization rotator, and said compound prism are configured and arranged such that a beam from at least one of said N diode-laser bars is transmitted through said compound prism via sequential reflections from said first and second surfaces, and such that a beam from at least one said M diode-laser bars has the polarization-orientation thereof rotated by said first polarization-rotator and is transmitted through said compound prism via transmission through said second surface; and wherein said plurality of diode-laser bars and said compound prism are
configured such that adjacent ones of said beams exit said compound prism parallel to each other, spaced apart by about one-half of said first distance, and with one of said adjacent beams plane-polarized in said first orientation and the other plane-polarized in said first orientation.

17. The apparatus of claim 16, further including a second polarization rotator arranged to rotate the polarization orientation of said first-orientation plane-polarized adjacent beam exiting said compound prism to said second orientation.

18. The apparatus of claim 16, further including a second polarization rotator arranged to rotate the polarization orientation of said second-orientation plane-polarized adjacent beam exiting said compound prism to said first orientation.

19. Apparatus, comprising:
a plurality M+N of diode-laser bars, each thereof emitting at least one beam of radiation plane-polarized in one of a first and a second polarization orientation, said polarization orientations being at ninety degrees to each other, and said diode-laser bars being selected and arranged such that all of said beams emitted thereby are polarized in the same polarization orientation, are parallel to each other, and are spaced a first distance apart;

a first polarization rotator arranged to rotate the polarization plane of beams having one of said first and second polarization orientations by ninety degrees;

a compound prism having a first, total reflecting surface and a second, polarization-selective surface said second surface being highly transmissive for radiation plane-polarized in said first polarization orientation and highly reflective for radiation plane-polarized in said second polarization orientation, said first and second surfaces being parallel to each other;

wherein, if said beams emitted by diode-laser bars are plane-polarized in said first polarization orientation, said first polarization rotator, and said compound prism are configured and arranged such that a beam from each of said N diode-laser bars has the polarization-orientation thereof rotated by said first polarization-rotator and is transmitted through said compound prism via sequential reflections from said first and second surfaces, and such that a beam from each of said M diode-laser bars is transmitted through said compound prism via transmission through said second surface;

wherein, if said beams emitted by diode-laser bars are plane-polarized in said second polarization orientation, said first polarization rotator, and said compound prism are configured and arranged such that a beam from each of said N diode-laser bars is transmitted through said compound prism via sequential reflections from said first and second surfaces, and such that a beam from each of said M diode-laser bars has the polarization-orientation thereof rotated by said first polarization-rotator and is transmitted through said compound prism via transmission through said second surface; and wherein said plurality of diode-laser bars and said compound prism are configured such that said M+N beams exit said compound prism parallel to each other with adjacent ones of said beams spaced apart by about one-half of said first distance, and with M of said adjacent beams plane-polarized in said first orientation and N of said beams plane-polarized in said second orientation.

20. The apparatus of claim 19, further including N second polarization rotators arranged to rotate the polarization orientation of said N second-orientation plane-polarized beams exiting said compound prism to said first orientation.

21. The apparatus of claim 19, further including M second polarization rotators arranged to rotate the polarization orientation of said M first-orientation plane-polarized adjacent beams exiting said compound prism to said second orientation.

22. Apparatus, comprising:

a plurality M+N of diode-laser bars, each thereof emitting at least one beam of radiation plane-polarized in a first polarization orientation and said diode-laser bars being selected and arranged such that said beams emitted thereby are parallel to each other, and are spaced a first distance V apart;

a first polarization rotator arranged to rotate the polarization plane of beams having said first orientation to a second polarization orientation perpendicular to said first orientation;

a first compound prism having a first, total reflecting surface and a second, polarization-selective surface said second surface being highly transmissive for radiation plane-polarized in said first polarization orientation and highly reflective for radiation plane-polarized in said second polarization orientation, said first and second surfaces being parallel to each other;

said first polarization rotator, and said first compound prism being configured and arranged such that a beam from each of said N diode-laser bars has the polarization-orientation thereof rotated by said first polarization-rotator and is transmitted through said first compound prism via sequential reflections from said first and second surfaces, and such that a beam from each of said M diode-laser bars is transmitted through said first compound prism via transmission through said second reflecting surface, and said plurality of diode-laser bars and said first compound prism being configured such that said M+N beams exit said first compound prism parallel to each other with adjacent ones of said beams spaced apart by a second distance equal to about V/2, and with M of said adjacent beams plane-polarized in said first orientation and N of said beams plane-polarized in said second orientation;

N second polarization rotators, each thereof arranged to intercept a corresponding one of said N second-orientation polarized beams exiting said first compound prism and to rotate the polarization plane of said second-orientation polarized beam to said first orientation, thereby creating M+N parallel beams, first-orientation polarized, and second-distance spaced-apart;

a third polarization rotator arranged to rotate the polarization plane of beams from said first orientation to said second orientation and a second compound prism, said second compound prism having a third, total reflecting surface and a fourth, polarization-selective surface, said fourth surface being highly transmissive for radiation plane-polarized in said first polarization orientation and highly reflective for radiation plane-polarized in said second polarization orientation, said third and fourth surfaces being parallel to each other; and said third polarization rotator, and said second compound prism being configured and arranged such that N of said second-distance spaced-apart beams have the polarization-orientation thereof rotated by said first polarization-rotator and are transmitted through said second compound prism via sequential reflections from said third and fourth surfaces, and such that M of said second-distance spaced-apart beams are transmitted through said second compound prism via transmission through said fourth surface, said second compound prism being configured such that said M+N beams exit said second compound prism parallel to each other with adjacent ones of said beams spaced apart by a third distance equal to about V/4.

23. Apparatus, comprising:

a plurality M+N of diode-laser bars, each thereof emitting at least one beam of radiation plane-polarized in a first polarization orientation and said diode-laser bars being selected and arranged such that all beams emitted thereby are parallel to each other, and are spaced a first distance V apart;

a first polarization rotator arranged to rotate the polarization plane of beams having said first orientation to a second polarization orientation perpendicular to said first orientation;

a first compound prism having a first, total reflecting surface and a second, polarization-selective surface said second surface being highly transmissive for radiation plane-polarized in said second polarization orientation and highly reflective for radiation plane-polarized in said first polarization orientation, said first and second surfaces being parallel to each other;

said first polarization rotator, and said first compound prism being configured and arranged such that a beam from each of said M diode-laser bars has the polarization-orientation thereof rotated by said first polarization-rotator and is transmitted through said first compound prism via said second surface, and such that a beam from each of said N diode-laser bars is transmitted through said first compound prism via sequential reflections from said first and second surfaces, and said plurality of diode-laser bars and said first compound prism being configured such that said M+N beams exit said first compound prism parallel to each other with adjacent ones of said beams spaced apart by a second distance equal to about V/2, and with one of said adjacent beams plane-polarized in said first orientation and the other plane-polarized in said second orientation;

N second polarization rotators, each thereof arranged to intercept a corresponding one of said N first-orientation polarized beams exiting said first compound prism and to rotate the polarization plane of said first-orientation polarized beam to said second orientation, thereby creating M+N second-orientation polarized, second-distance spaced-apart, parallel beams;

a third polarization rotator arranged to rotate the polarization plane of beams from said second orientation to said first orientation and a second compound prism, said second compound prism having a third, total reflecting surface and a fourth, polarization-selective surface, said fourth surface being highly transmissive for radiation plane-polarized in said second polarization orientation and highly reflective for radiation plane-polarized in said first polarization orientation, said third and fourth surfaces being parallel to each other; and said third polarization rotator, and said second compound prism being configured and arranged such that M of said second distance spaced-apart beams have the polarization-orientation thereof rotated by said third polarization-rotator and are transmitted through said second compound prism via said fourth surface, and such that N of said second distance spaced-apart beams are transmitted through said second compound prism via sequential reflections from said third and fourth surfaces, said second compound prism being configured such that said M+N beams exit said second compound prism parallel to each other, with adjacent ones of said beams spaced apart by a third distance equal to about V/4.

24. Apparatus, comprising:

a plurality M+N of diode-laser bars, each thereof emitting at least one pair of beams of radiation plane-polarized in a first polarization orientations beams in said pairs thereof being spaced apart by a distance S, and parallel to each other;

said diode-laser bars being selected and arranged such that said pairs of beams emitted thereby are parallel to each other, and are spaced a first distance V apart, with corresponding beams in each pair being aligned;

a first polarization rotator arranged to rotate the polarization plane of beams having said first orientation to a second polarization orientation perpendicular to said first orientation;

a first compound prism having a first, total reflecting surface and a second, polarization-selective surface said second surface being highly transmissive for radiation plane-polarized in said first polarization orientation and highly reflective for radiation plane-polarized in said second polarization orientation, said first and second surfaces being parallel to each other;

said first polarization rotator, and said first compound prism being configured and arranged such that a said pair of beams from each of said N diode-laser bars has the polarization-orientation thereof rotated by said first polarization-rotator and is transmitted through said first compound prism via sequential reflections from said first and second surfaces, and such that a said pair of beams from each of said M diode-laser bars is transmitted through said first compound prism via transmission through said second reflecting surface, and said plurality of diode-laser bars and said first compound prism being configured such that said M+N pairs of beams exit said first compound prism parallel to each other with adjacent ones of said pairs of beams spaced apart by a second distance equal to about V/2, and with M of said pairs of beams plane-polarized in said first orientation and N of said pairs of beams plane-polarized in said second orientation;

N second polarization rotators, each thereof arranged to intercept a corresponding one of said N pairs of second-orientation polarized beams exiting said first compound prism and to rotate the polarization plane of said second-orientation polarized pairs of beams to said first orientation, thereby creating M+N parallel pairs of beams, first-orientation polarized, and second-distance spaced-apart, with corresponding beams in each pair aligned;

a third polarization rotator arranged to rotate the polarization plane of beams from said first orientation to said second orientation and a second compound prism, said second compound prism having a third, total reflecting surface and a fourth, polarization-selective surface, said fourth surface being highly transmissive for radiation plane-polarized in said first polarization orientation and highly reflective for radiation plane-polarized in said second polarization orientation, said third and fourth surfaces being parallel to each other; said third polarization rotator;

said second compound prism being configured and arranged such that M+N aligned beams from said second-distance spaced-apart pairs thereof have the polarization-orientation thereof rotated by said first polarization-rotator and are transmitted through said second compound prism via sequential reflections from said third and fourth surfaces and exiting said second compound on an exit path; and said second compound prism being configured and arranged such that M+N aligned beams from said second-distance spaced-apart pairs thereof are transmitted through said second compound prism via transmission through said fourth surface and exit said second compound prism along said exit path, whereby M+N beams exit said second compound prism parallel to each other with adjacent ones of said beams spaced apart by a third distance equal to about V/2 and with each beam including a first-orientation polarized component and a second-orientation polarized component.

25. Apparatus, for reducing spacing between a plurality M+N of laser-radiation beams, each of the beams being plane-polarized in one of a first and a second polarization orientation, the polarization orientations being at ninety degrees to each other, and the beams being parallel to each other, and spaced apart by a first distance V, the apparatus comprising:

a first polarization rotator arranged to rotate the polarization plane of a beam by ninety degrees;

a compound prism having a first, total reflecting surface and a second, polarization-selective surface, said second surface being highly transmissive for radiation plane-polarized in the first polarization orientation and highly reflective for radiation plane-polarized in the second polarization orientation, said first and second surfaces being parallel to each other;

wherein, if the beams are plane-polarized in the first polarization orientation, said first polarization rotator, and said compound prism are configured and arranged such that at least one of the N beams has the polarization-orientation thereof rotated by said first polarization-rotator and is transmitted through said compound prism via sequential reflections from said first and second surfaces, and such at least one of the M beams is transmitted through said compound prism via transmission through said second surface;

wherein, if the beams are plane-polarized in the second polarization orientation, said first polarization rotator, and said compound prism are configured and arranged such at least one the N beams is transmitted through said compound prism via sequential reflections from said first and second surfaces, and such that at least one of the M beams has the polarization-orientation thereof rotated by said first polarization-rotator and is transmitted through said compound prism via transmission through said second surface; and wherein said plurality of diode-laser bars and said compound prism are configured such that adjacent ones of said transmitted beams exit said compound prism parallel to each other, and spaced apart by a second distance less than said first distance.

26. The apparatus of claim 25, wherein said second distance is one-half said first distance.

27. The apparatus of claim 25, wherein said adjacent ones of said beams exiting said compound have opposite polarization orientations.

28. The apparatus of claim 25, wherein said first and second surfaces of said compound prism are inclined at 45 degrees to the propagation direction of said beams.

29. The apparatus of claim 25, wherein the beams are polarized in the first orientation; and wherein said first polarization rotator, and said compound prism are configured and arranged such that each of the N beams has the polarization-orientation thereof rotated by said first polarization-rotator and is transmitted through said compound prism via sequential reflections from said first and second surfaces, and such that each of the M beams is transmitted through said compound prism via transmission through said second surface.

30. The apparatus of claim 25, wherein the beams are polarized in the second orientation; and wherein said first polarization rotator, and said compound prism are configured and arranged such that each of the N beams is transmitted through said compound prism via sequential reflections from said first and second surfaces, and such that each of the M beams is transmitted through said compound prism via sequential reflections from said first and second surfaces.

* * * * *